US011270988B2

(12) United States Patent
Or-Bach et al.

(10) Patent No.: US 11,270,988 B2
(45) Date of Patent: Mar. 8, 2022

(54) 3D SEMICONDUCTOR DEVICE(S) AND STRUCTURE(S) WITH ELECTRONIC CONTROL UNITS

(71) Applicants: Zvi Or-Bach, Haifa (IL); Jin-Woo Han, San Jose, CA (US); Brian Cronquist, Klamath Falls, OR (US)

(72) Inventors: Zvi Or-Bach, Haifa (IL); Jin-Woo Han, San Jose, CA (US); Brian Cronquist, Klamath Falls, OR (US)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

(21) Appl. No.: 17/151,867

(22) Filed: Jan. 19, 2021

(65) Prior Publication Data

US 2021/0242189 A1   Aug. 5, 2021

Related U.S. Application Data

(60) Provisional application No. 63/123,464, filed on Dec. 9, 2020, provisional application No. 63/118,908, filed
(Continued)

(51) Int. Cl.
*H01L 25/18* (2006.01)
*H01L 23/00* (2006.01)
(Continued)

(52) U.S. Cl.
CPC ........ *H01L 25/18* (2013.01); *H01L 21/76898* (2013.01); *H01L 23/473* (2013.01); *H01L 23/481* (2013.01); *H01L 24/08* (2013.01);

*H01L 24/80* (2013.01); *H01L 25/0657* (2013.01); *H01L 25/50* (2013.01);
(Continued)

(58) Field of Classification Search
CPC ..... H01L 25/15; H01L 23/473; H01L 23/481; H01L 21/76898; H01L 24/08; H01L 24/80; H01L 25/0657

See application file for complete search history.

(56) References Cited

U.S. PATENT DOCUMENTS 8,273,610 B2 * 9/2012 Or-Bach ........... H01L 27/10802
                                                                  438/142
8,395,191 B2 * 3/2013 Or-Bach ........... H01L 27/11578
                                                                  257/213
(Continued)

*Primary Examiner* — Nathan W Ha
(74) *Attorney, Agent, or Firm* — Patent PC; Bao Tran

(57) ABSTRACT

A 3D device, the first level including first transistors and a first interconnect; a second level with second transistors overlaying the first level; a third level with third transistors overlaying the second level; a plurality of electronic circuit units (ECUs), where each ECU includes a first circuit with a portion of the first transistors, where each of the ECUs includes a second circuit including a portion of the second transistors, where each of the plurality of ECUs includes a third circuit, which includes a portion of the third transistors, where each of the ECUs includes a vertical data bus, where the vertical data bus has between eight pillars and three hundreds pillars, where the vertical data bus provides electrical connections between the first and second circuits, where the third level includes an array of memory cells, and where the second circuit includes a memory control circuit.

20 Claims, 26 Drawing Sheets

Related U.S. Application Data on Nov. 28, 2020, provisional application No. 63/115,000, filed on Nov. 17, 2020, provisional application No. 63/108,433, filed on Nov. 1, 2020, provisional application No. 62/983,559, filed on Feb. 28, 2020, provisional application No. 62/963,166, filed on Jan. 20, 2020, provisional application No. 62/986,772, filed on Mar. 9, 2020.

(51) Int. Cl.
    *H01L 23/48*     (2006.01)
    *H01L 23/473*     (2006.01)
    *H01L 21/768*     (2006.01)
    *H01L 25/00*     (2006.01)
    *H01L 25/065*     (2006.01)

(52) U.S. Cl.
CPC ............... *H01L 2224/08145* (2013.01); *H01L 2224/80895* (2013.01); *H01L 2224/80896* (2013.01); *H01L 2225/06534* (2013.01); *H01L 2225/06541* (2013.01); *H01L 2225/06589* (2013.01); *H01L 2924/1431* (2013.01); *H01L 2924/1436* (2013.01)

(56) References Cited

U.S. PATENT DOCUMENTS

| | | | |
|---|---|---|---|
| 2016/0093591 A1* | 3/2016 | Lan | H01L 21/6835 257/506 |
| 2018/0060475 A1* | 3/2018 | Sinha | G06F 30/392 |
| 2018/0366508 A1* | 12/2018 | Goto | H01L 27/14614 |
| 2020/0194412 A1* | 6/2020 | Brewer | G11C 29/886 |
| 2020/0328186 A1* | 10/2020 | Liu | H01L 24/83 |
| 2020/0365463 A1* | 11/2020 | Or-Bach | H01L 21/8238 |
| 2020/0381379 A1* | 12/2020 | Chen | H01L 22/14 |
| 2020/0411445 A1* | 12/2020 | Chen | H01L 23/3128 |
| 2020/0411594 A1* | 12/2020 | Sekar | H01L 27/0688 |
| 2020/0411636 A1* | 12/2020 | Kao | H01L 25/50 |
| 2020/0411709 A1* | 12/2020 | Einav | H01L 31/036 |
| 2021/0020457 A1* | 1/2021 | Or-Bach | H01L 21/823487 |
| 2021/0098441 A1* | 4/2021 | Wuu | H01L 23/481 |
| 2021/0118699 A1* | 4/2021 | Or-Bach | H01L 23/367 |
| 2021/0125966 A1* | 4/2021 | Shih | H01L 25/0657 |
| 2021/0125967 A1* | 4/2021 | Zhai | H01L 24/96 |
| 2021/0134645 A1* | 5/2021 | Or-Bach | H01L 27/11807 |
| 2021/0143071 A1* | 5/2021 | Lan | H01L 23/15 |
| 2021/0151450 A1* | 5/2021 | Or-Bach | H01L 27/1116 |
| 2021/0159276 A1* | 5/2021 | Sekar | H01L 21/76254 |

\* cited by examiner

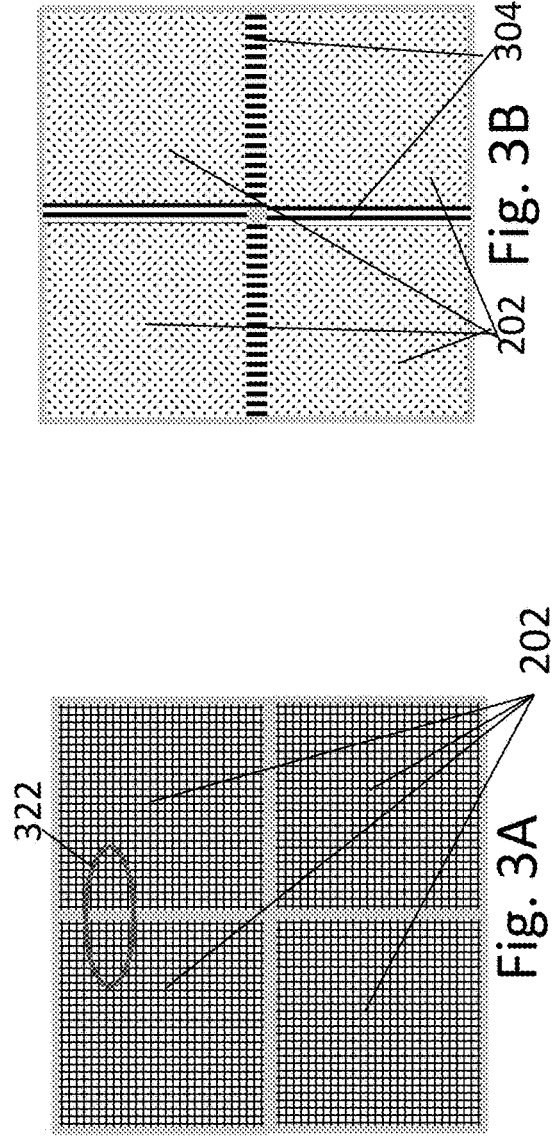
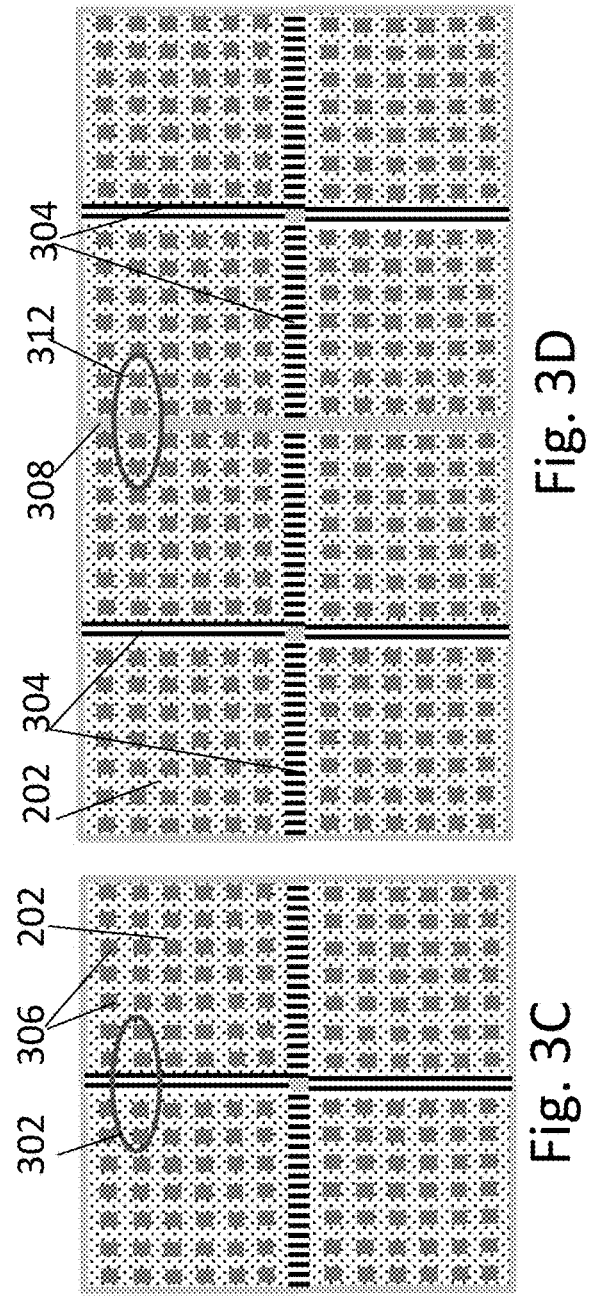
Fig. 3A
Fig. 3B
Fig. 3C
Fig. 3D

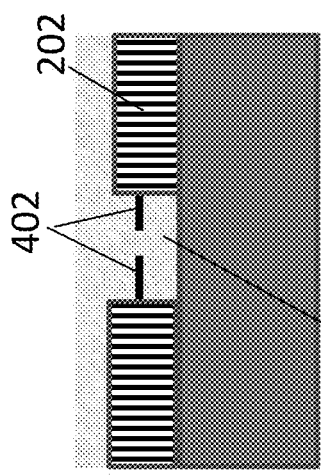
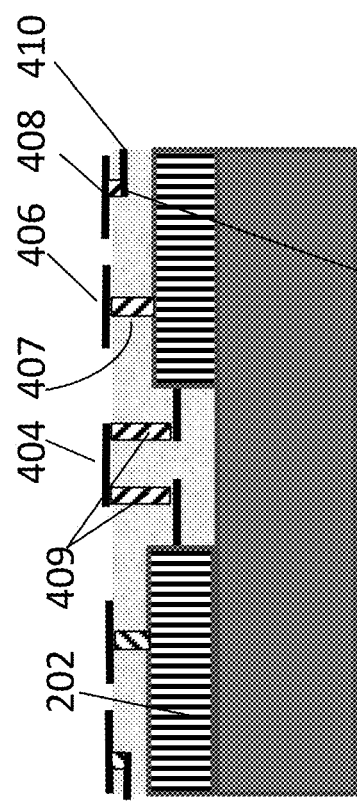
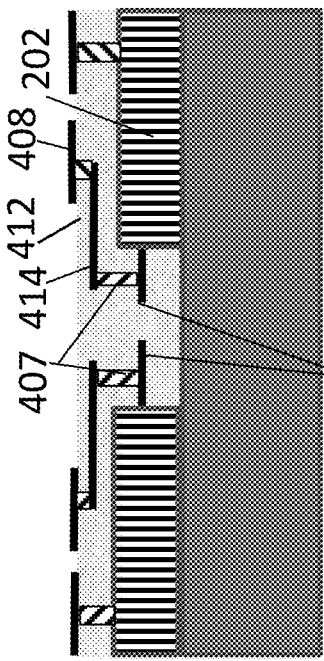

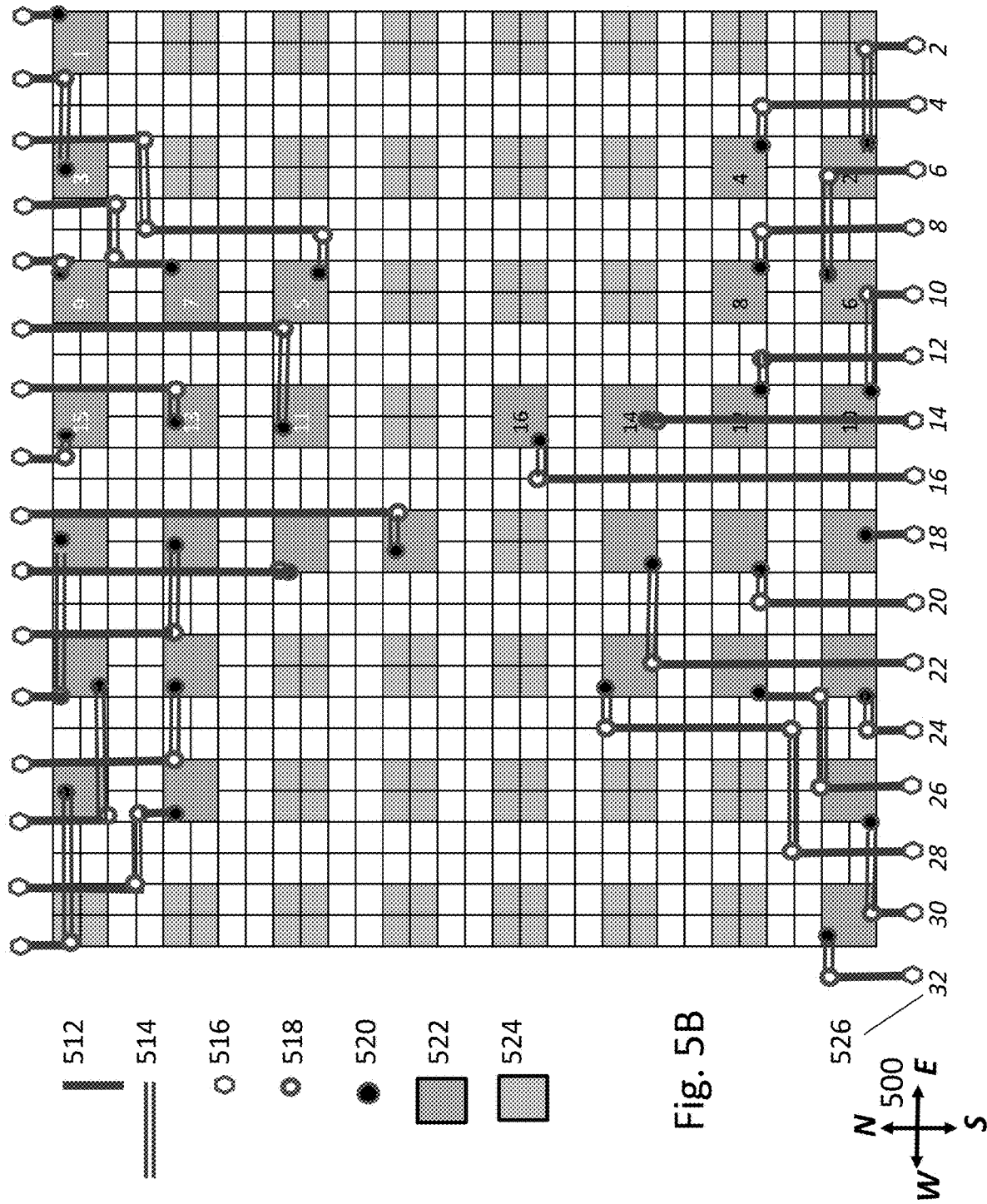

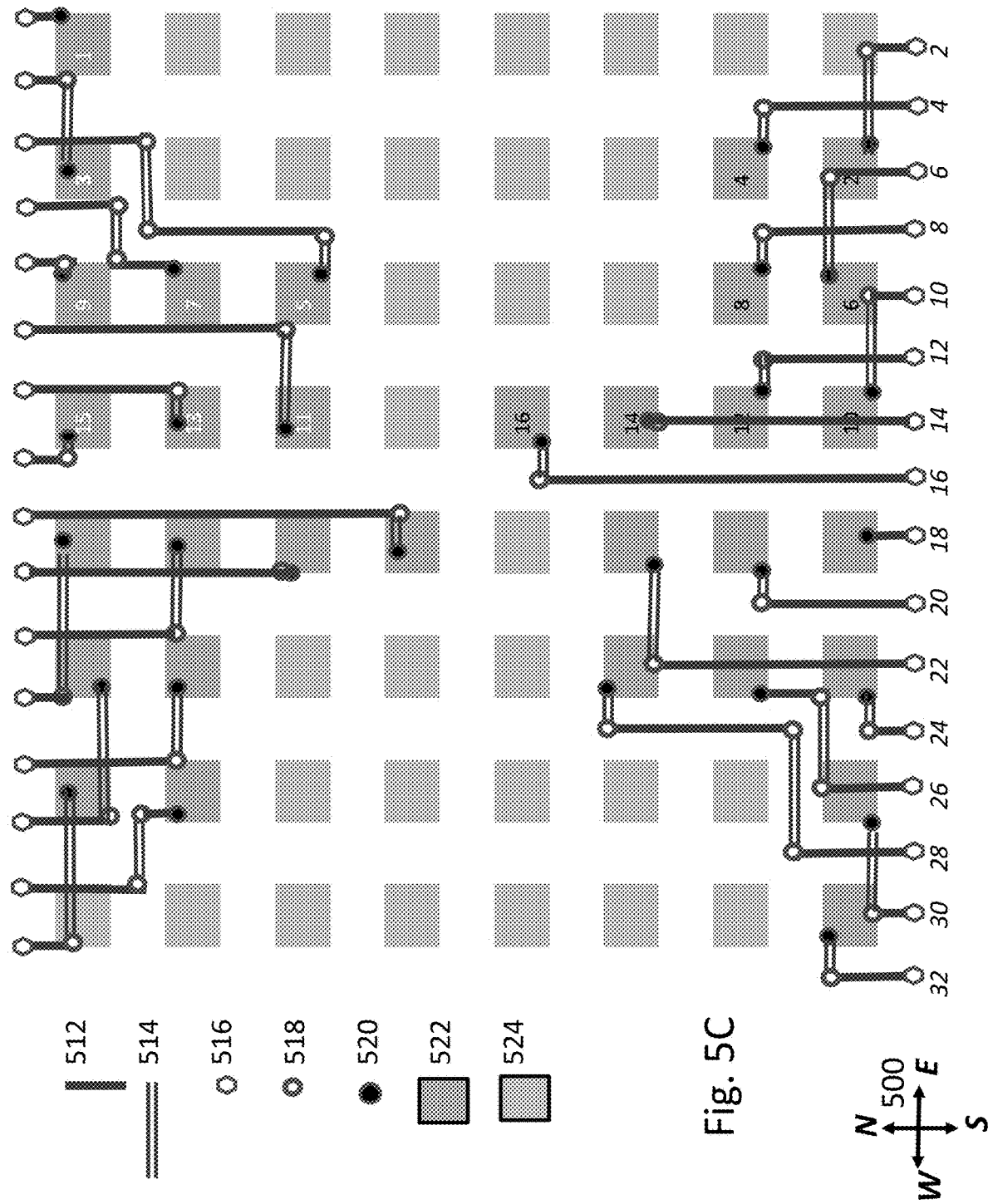

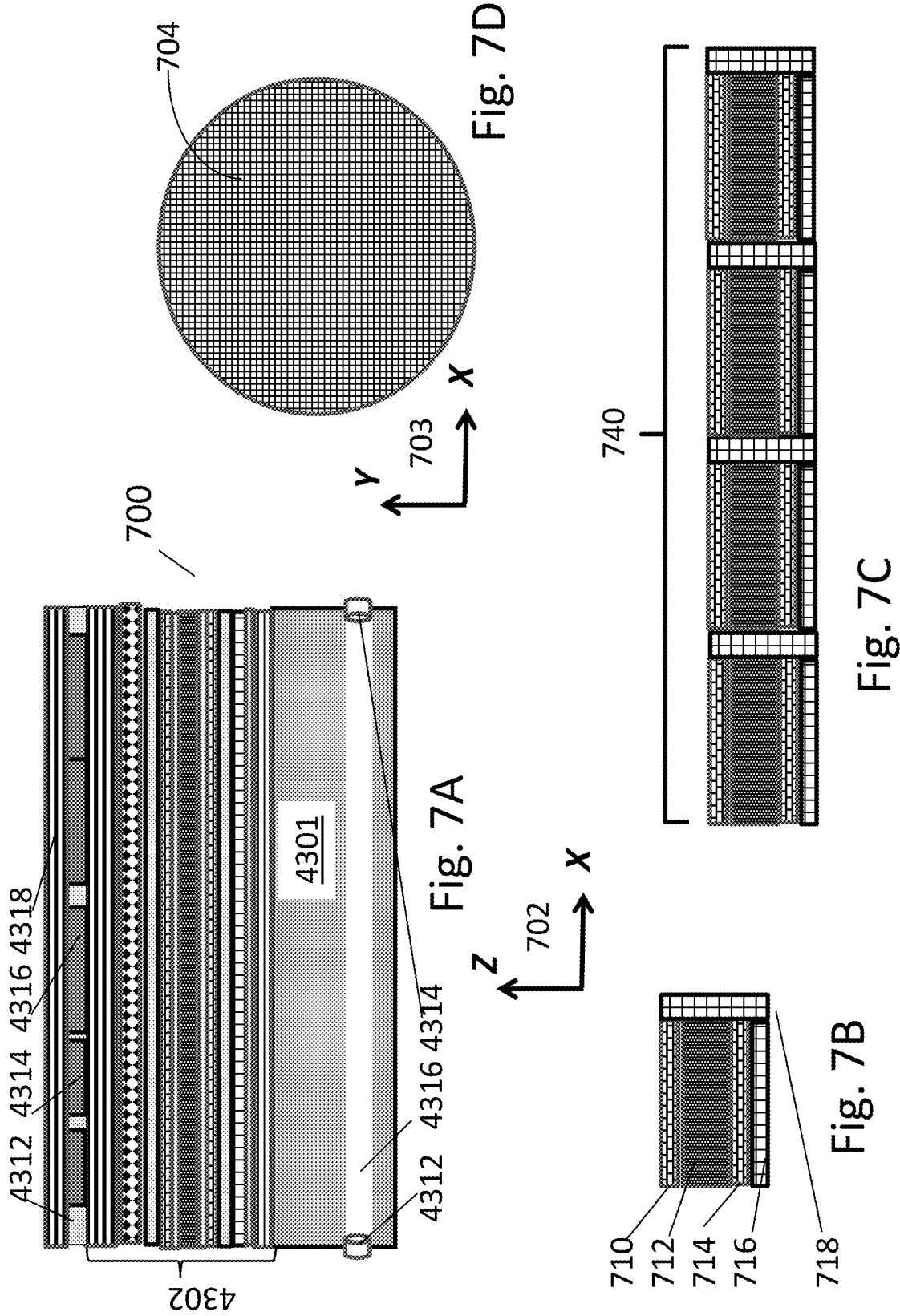

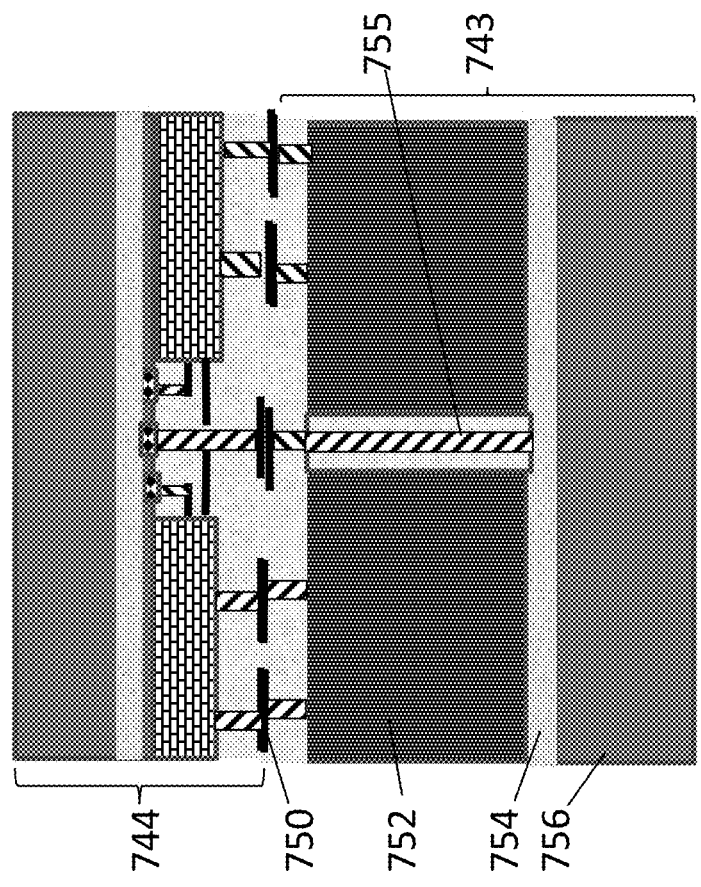
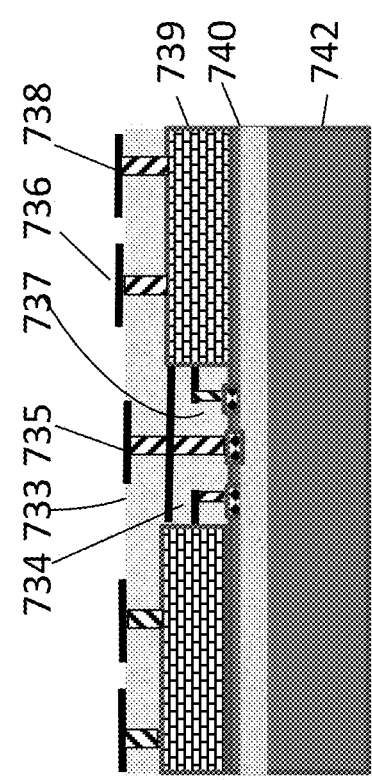
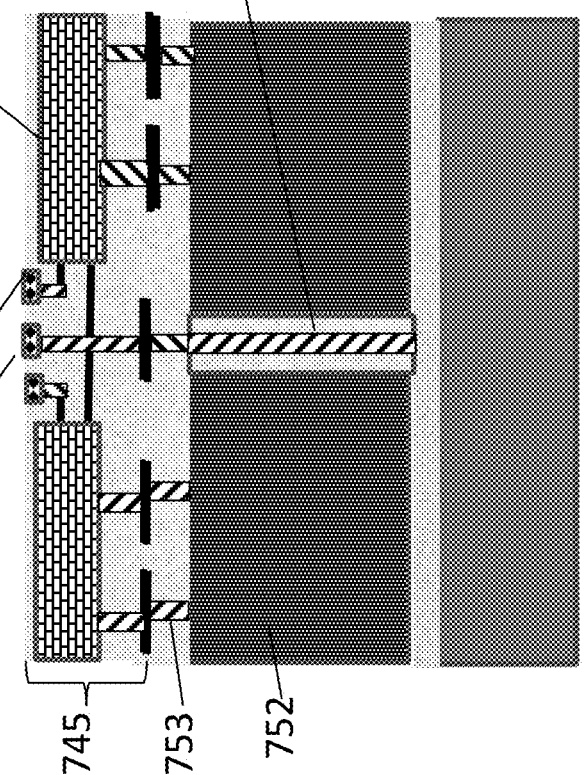
Fig. 7E
Fig. 7F
Fig. 7G

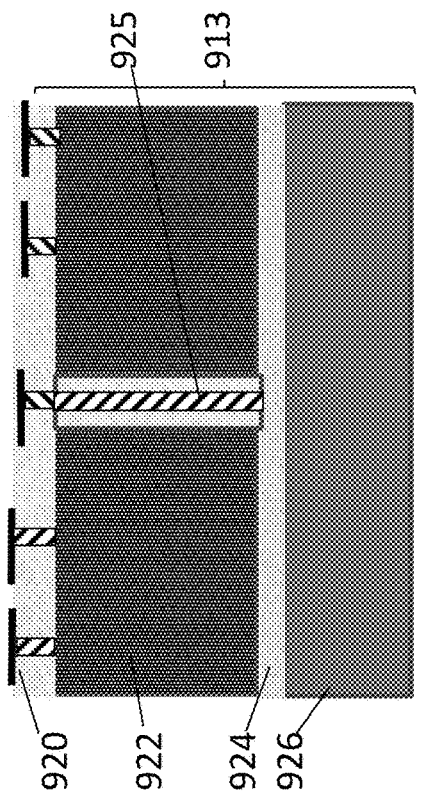
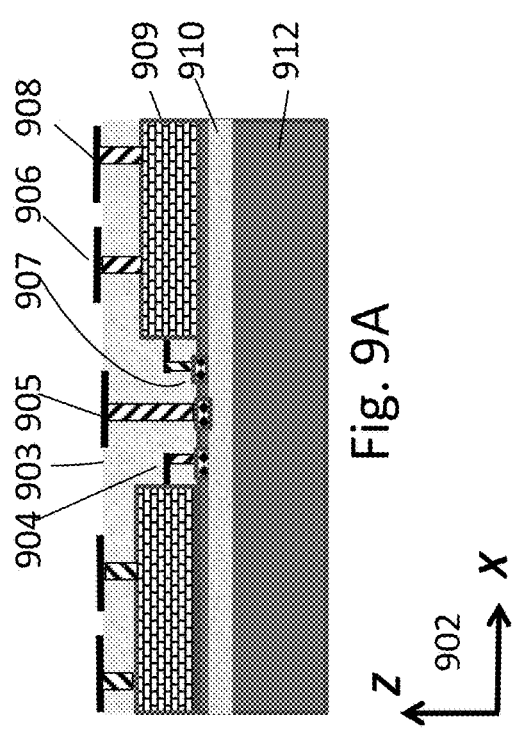
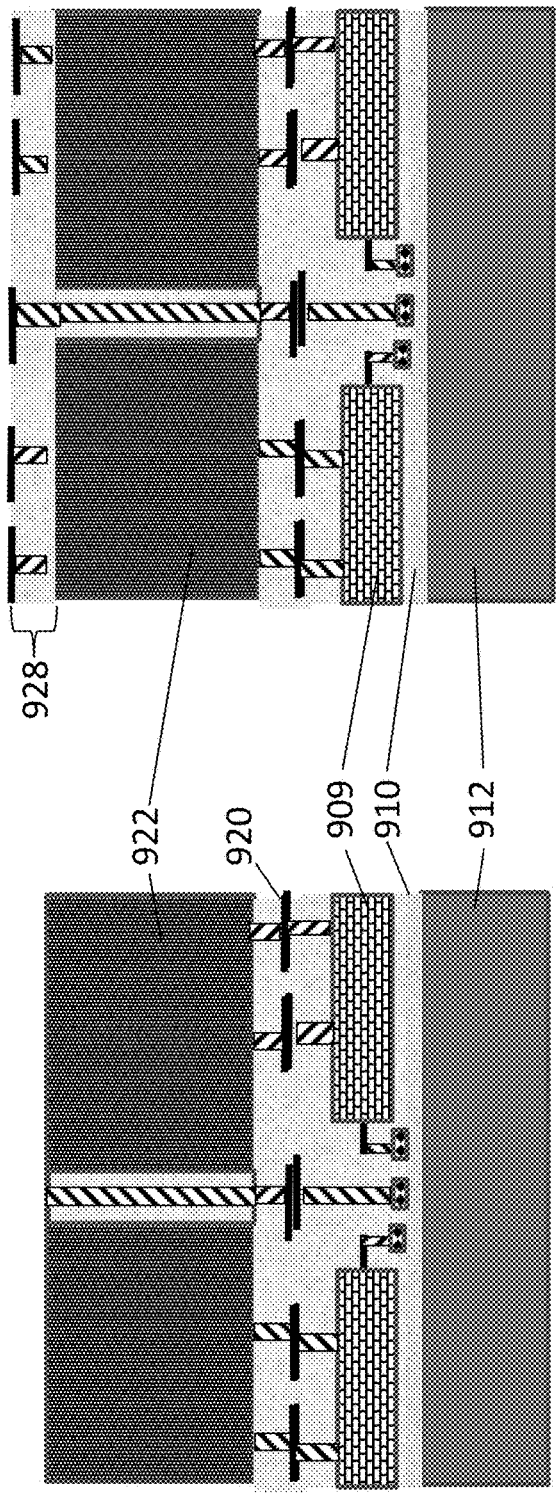
Fig. 9A
Fig. 9B
Fig. 9C
Fig. 9D

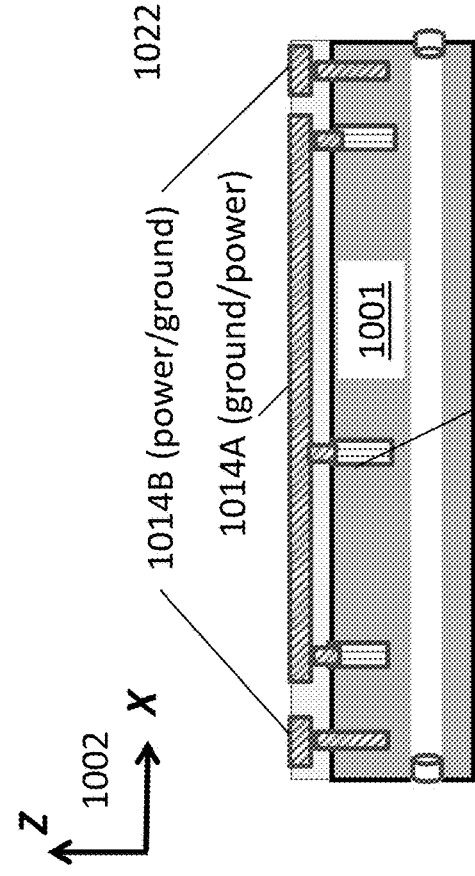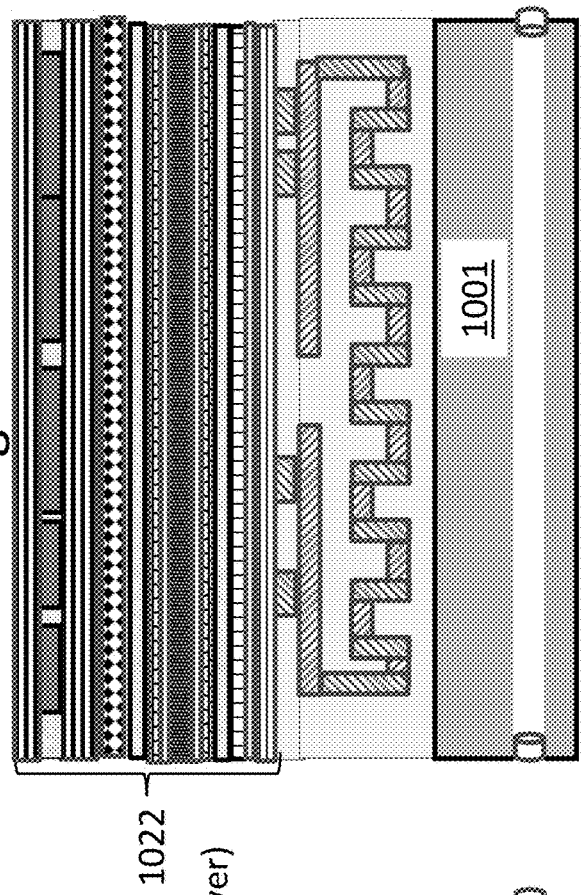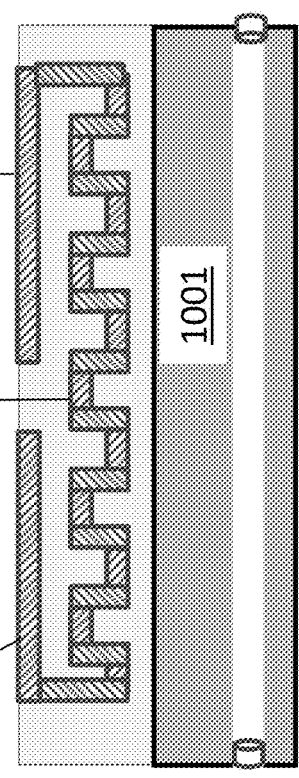

Fig. 11

| Line | Node[nm] | 90 | 65 | 40 | 28 | 20 | 16/12 | 10 | 7 | 5 |
|---|---|---|---|---|---|---|---|---|---|---|
| | Mass production year and quarter[25] | 2004 Q4 | 2006 Q4 | 2009 Q1 | 2011 Q4 | 2014 Q3 | 2015 Q3 | 2017 Q2 | 2018 Q3 | 2020 Q1 |
| 2 | Capital investment per wafer processed per year | $4,649 | $5,456 | $6,404 | $8,144 | $10,356 | $11,220 | $13,169 | $14,267 | $16,740 |
| 3 | Net capital depreciation at start of 2020 (25.29%/year) | 65% | 65% | 65% | 65% | 65% | 65% | 55.1% | 35.4% | 0.0% |
| 4 | Undepreciated capital per wafer processed per year (remaining value at start of 2020) | $1,627 | $1,910 | $2,241 | $2,850 | $3,625 | $3,927 | $5,907 | $9,213 | $16,746 |
| 5 | Capital consumed per wafer processed in 2020 | $411 | $483 | $567 | $721 | $917 | $993 | $1,494 | $2,330 | $4,235 |
| 6 | Other costs and markup per wafer | $1,239 | $1,454 | $1,707 | $2,171 | $2,760 | $2,990 | $4,498 | $7,016 | $12,753 |
| 7 | Foundry sale price per wafer | $1,650 | $1,937 | $2,274 | $2,891 | $3,677 | $3,984 | $5,992 | $9,346 | $16,988 |

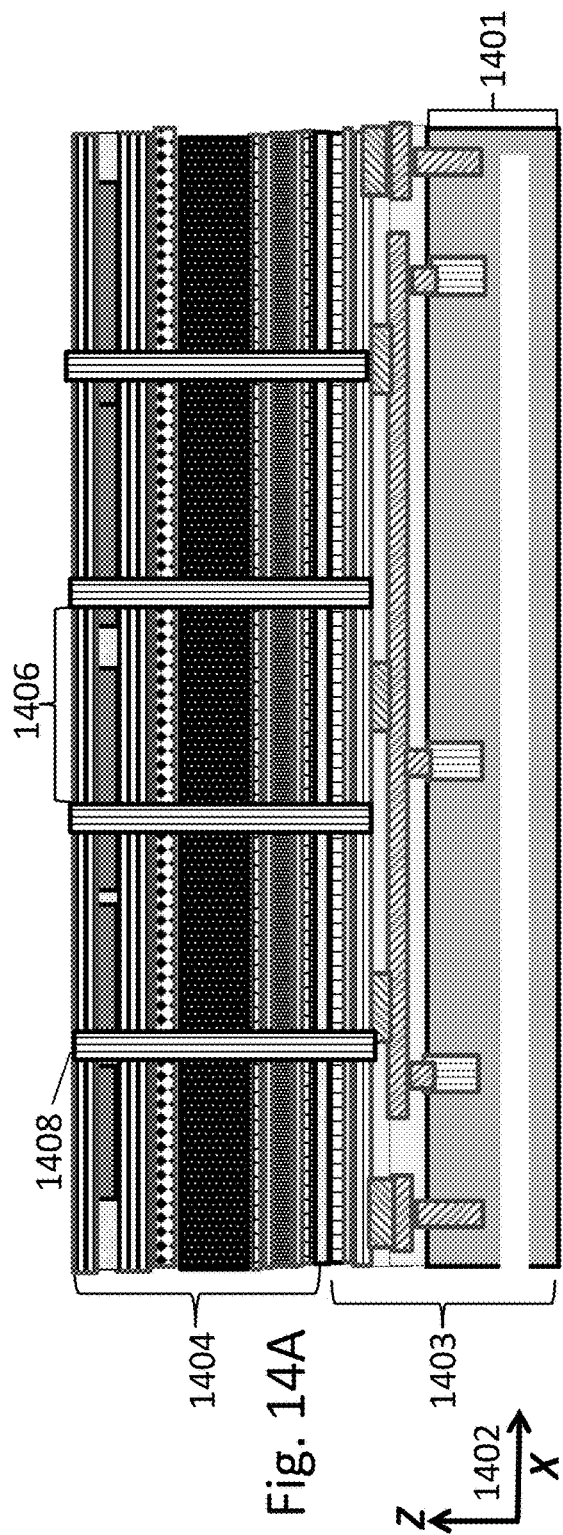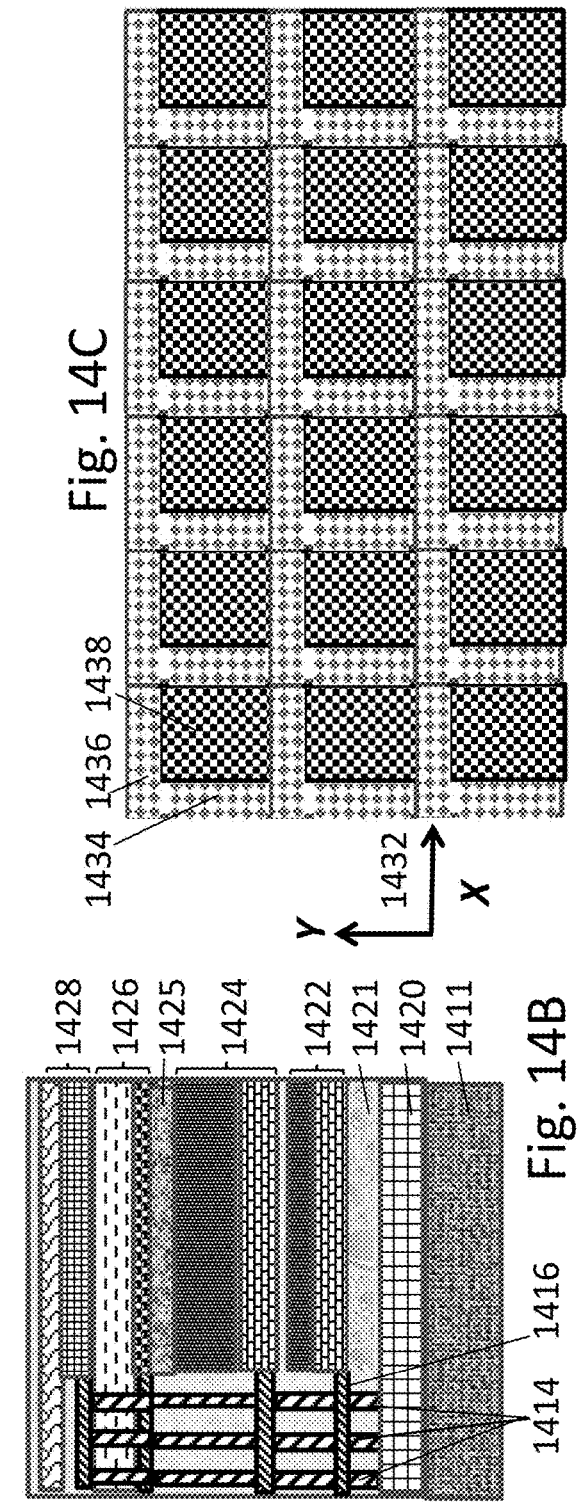

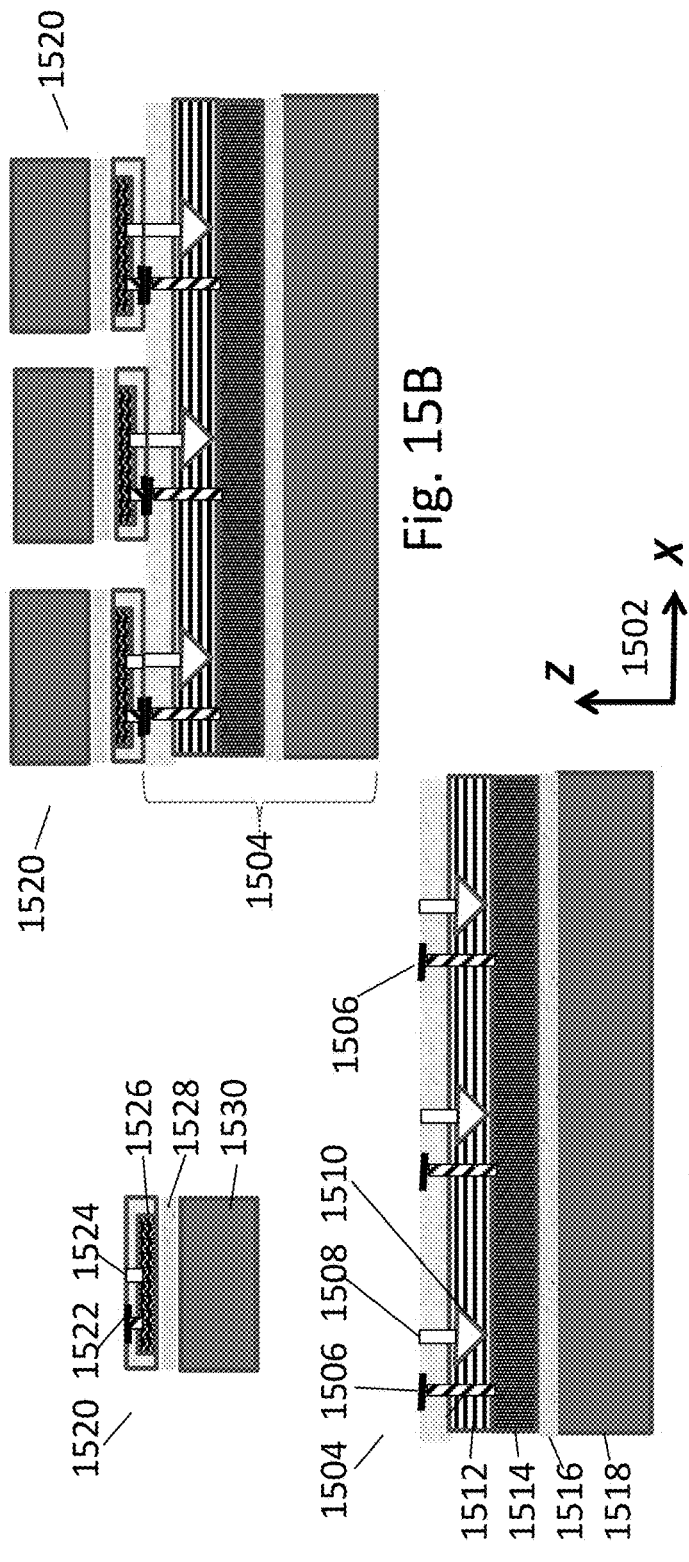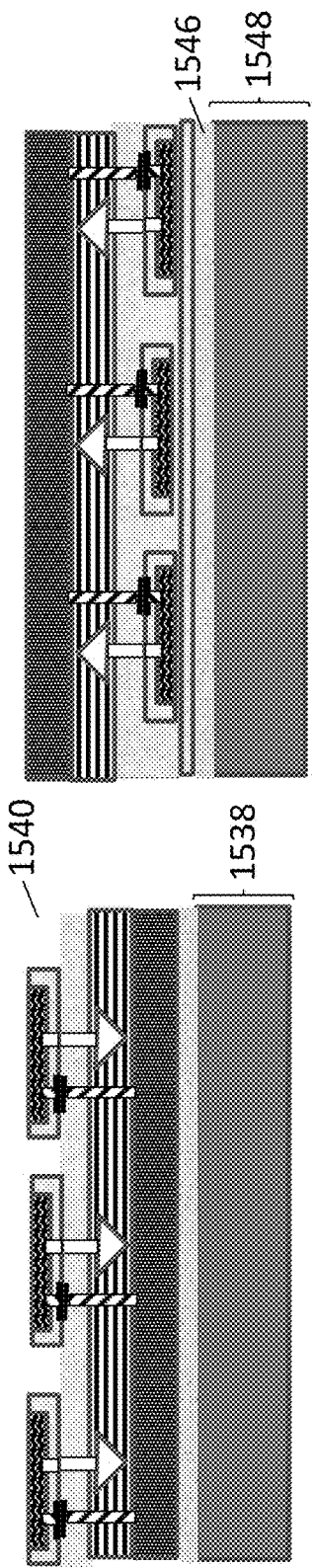
Fig. 15A Fig. 15B Fig. 15C Fig. 15D

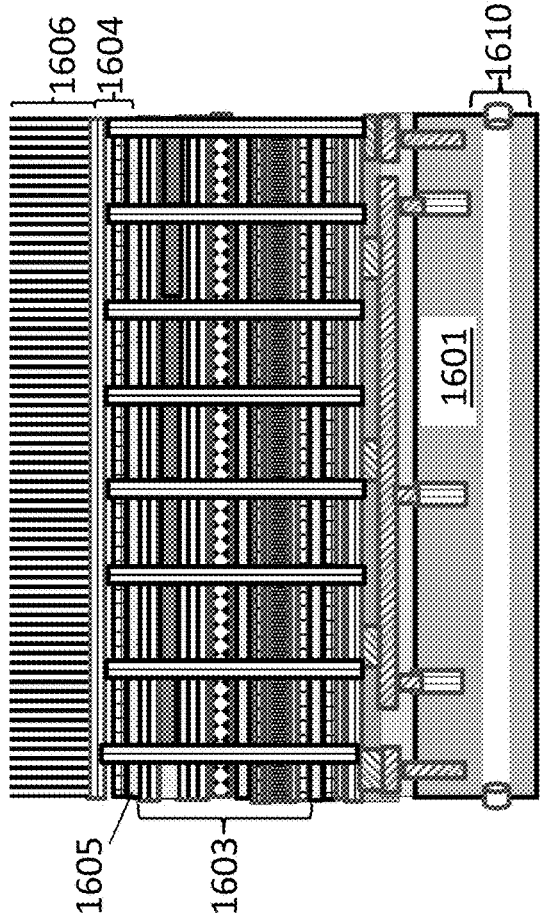
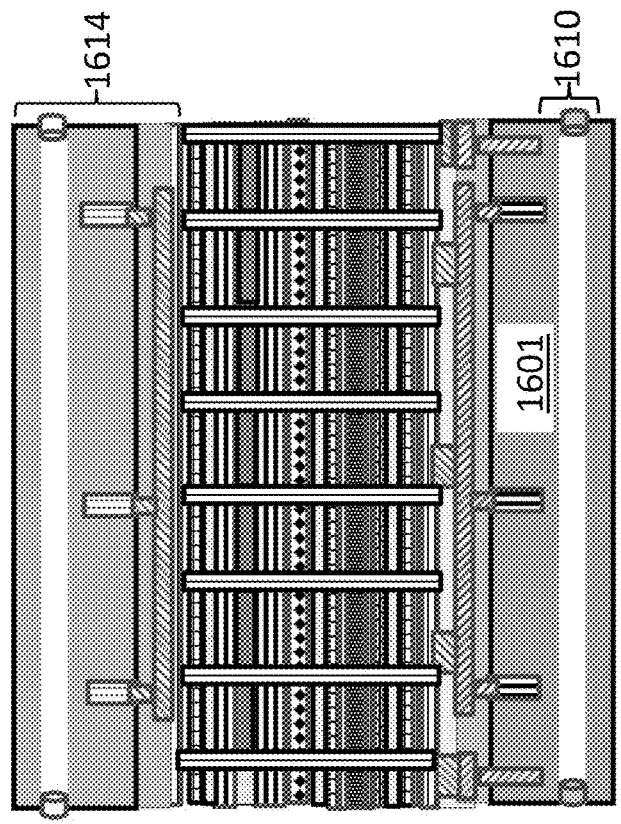
Fig. 16A
Fig. 16B

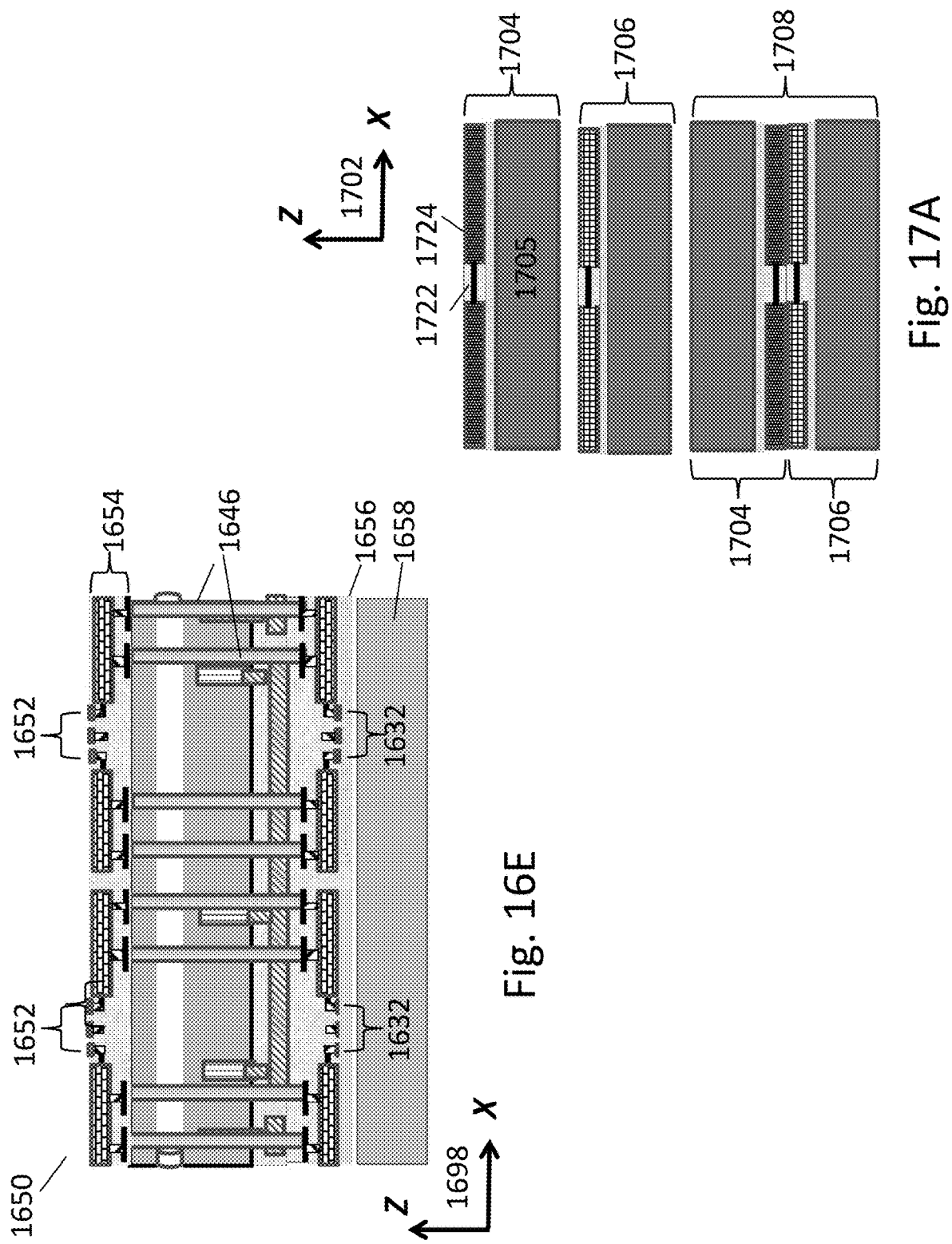

3D SEMICONDUCTOR DEVICE(S) AND STRUCTURE(S) WITH ELECTRONIC CONTROL UNITS

BACKGROUND OF THE INVENTION

1. Field of the Invention

This application relates to the general field of Integrated Circuit (IC) devices and fabrication methods, and more particularly to multilayer or Three Dimensional Integrated Memory Circuit (3D-Memory) and Three Dimensional Integrated Logic Circuit (3D-Logic) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low and wire.

There are many techniques to construct 3D stacked integrated circuits or chips including:

Through-silicon via (TSV) technology: Multiple layers of dice are constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318; and pending U.S. Patent Application Publications and applications, Ser. Nos. 14/642,724, 15/150,395, 15/173,686, 62/651,722; 62/681,249, 62/713,345, 62/770,751, 62/952,222, 2020/0013791, Ser. No. 16/558,304; and PCT Applications (and Publications): PCT/US2010/052093, PCT/US2011/042071 (WO2012/015550), PCT/US2016/52726 (WO2017/053329), PCT/US2017/052359 (WO2018/071143), PCT/US2018/016759 (WO2018/144957), and PCT/US2018/52332 (WO 2019/060798). The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, and 10,679,977. The entire contents of the foregoing patents, publications, and applications are incorporated herein by reference.

In addition, the entire contents of U.S. Pat. No. 10,014, 318, U.S. patent application publication 2018/0350823 and U.S. patent applications 62/963,166, 62/963,270, 62/983, 559, 62/986,772, 63,108,433, 63/118,908, 63/123,464 are incorporated herein by reference.

Additionally the 3D technology according to some embodiments of the invention may enable some very innovative IC devices alternatives with reduced development costs, novel and simpler process flows, increased yield, and other illustrative benefits.

SUMMARY

The invention relates to multilayer or Three Dimensional Integrated Circuit (3D IC) devices and fabrication methods. Important aspects of 3D IC are technologies that allow layer transfer. These technologies include technologies that support reuse of the donor wafer, and technologies that support fabrication of active devices on the transferred layer to be transferred with it.

In one aspect, a 3D device, said device comprising: a first level comprising first transistors, said first level comprising a first interconnect; a second level comprising second transistors, said second level overlaying said first level; a third level comprising third transistors, said third level overlaying said second level; a plurality of electronic circuit units (ECUs), wherein each of said plurality of ECUs comprises a first circuit, said first circuit comprising a portion of said first transistors, wherein each of said plurality of ECUs comprises a second circuit, said second circuit comprising a portion of said second transistors, wherein each of said plurality of ECUs comprises a third circuit, said third circuit comprising a portion of said third transistors, wherein each of said ECUs comprises a vertical data bus, wherein said vertical data bus comprises greater than eight pillars and less than three hundreds pillars, wherein said vertical data bus provides electrical connections between said first circuit and said second circuit, wherein each of said ECUs comprises vertical control lines, wherein said vertical control lines comprise more than eight hundreds pillars, and wherein said vertical control lines provide electrical connections between said second circuit and said third circuit.

In another aspect, a 3D device, the device comprising: a first level comprising first transistors, said first level comprising a first interconnect; a second level comprising second transistors, said second level overlaying said first level; a third level comprising third transistors, said third level overlaying said second level; a plurality of electronic circuit units (ECUs), wherein each of said plurality of ECUs comprises a first circuit, said first circuit comprising a portion of said first transistors, wherein each of said plurality of ECUs comprises a second circuit, said second circuit comprising a portion of said second transistors, wherein each of said plurality of ECUs comprises a third circuit, said third circuit comprising a portion of said third transistors, wherein each of said ECUs comprises a vertical data bus, wherein said vertical data bus comprises greater than eight pillars and less than three hundreds pillars, wherein said vertical data bus provides electrical connections between said first circuit and said third circuit, wherein each of said ECUs comprises vertical control lines, wherein said vertical control lines comprise more than eight hundreds pillars, and wherein said vertical control lines provide electrical connections between said second circuit and said third circuit.

In another aspect, a 3D device, the device comprising: a first level comprising first transistors, said first level comprising a first interconnect; a second level comprising second transistors, said second level overlaying said first level; a third level comprising third transistors, said third level overlaying said second level; a plurality of electronic circuit units (ECUs), wherein each of said plurality of ECUs comprises a first circuit, said first circuit comprising a portion of said first transistors, wherein each of said plurality of ECUs comprises a second circuit, said second circuit comprising a portion of said second transistors, wherein each of said plurality of ECUs comprises a third circuit, said third circuit comprising a portion of said third transistors, wherein each of said ECUs comprises a vertical data bus, wherein said vertical data bus comprises greater than eight pillars and less than three hundreds pillars, wherein said vertical data bus provides electrical connections between said first circuit and said second circuit, wherein said third level comprises an array of memory cells, and wherein said second circuit comprises a memory control circuit.

BRIEF DESCRIPTION OF THE DRAWINGS

Various embodiments of the invention will be understood and appreciated more fully from at least the following detailed description, taken in conjunction with the drawings in which:

FIGS. 3A-3D are example illustrations of various arrangements and customizations of the 2D repeating pattern memory structure of FIG. 2;

FIGS. 4A-4C are example illustrations of cut views of FIGS. 3B-3D illustrating various unit to unit and within unit connectivity;

FIGS. 5A-5E are example illustrations of word-line pin/pad connectivity lay outs and bit-line pin/pad connectivity lay outs;

FIG. 7A is an example illustration of FIG. 43E of U.S. application Ser. No. 16/558,304;

FIG. 7B is an example illustration of a memory unit that includes memory and memory controller;

FIG. 7C is an example illustration of 4 memory units of FIG. 7B formed as an array;

FIG. 7D is an example illustration of a wafer sized array of memory units;

FIGS. 7E-7G are example illustrations of cut views of a formation process of memory strata which can be stored and then later bonded to other device structures to form systems;

FIGS. 9A-9G are example illustrations of a 3D strata formation flow which could form a 3D compute device;

FIGS. 10A-10D are example illustrations of various power delivery substrate architectures to effectively deliver power multiple levels of active devices via heterogeneous integrations;

FIG. 11 is an example table illustrating wafer processing costs are highly dependent on the type of process line used;

FIGS. 14A-14E are example illustrations various level integrations to form various types of 3D systems;

FIGS. 15A-15D are example illustrations of DieM-Levels being part of a 3D system with photonic X-Y connectivity;

FIGS. 16A-16E are example illustrations of various heat removal techniques and structures which may be built-in to 3D systems; for example, SubstrateM-Levels in a 3D system could include multiple compute levels and memory levels with X-Y connectivity levels in-between, while the system heat could be managed by liquid cooling; and FIGS. 17A-17D are example illustrations of full M-Levels being formed via multiple steps of simple bonding and thinning, and then using TSV processing to form the vertical bus pillars through the levels-stack and then form the pin/pads.

DETAILED DESCRIPTION

Figure 2:
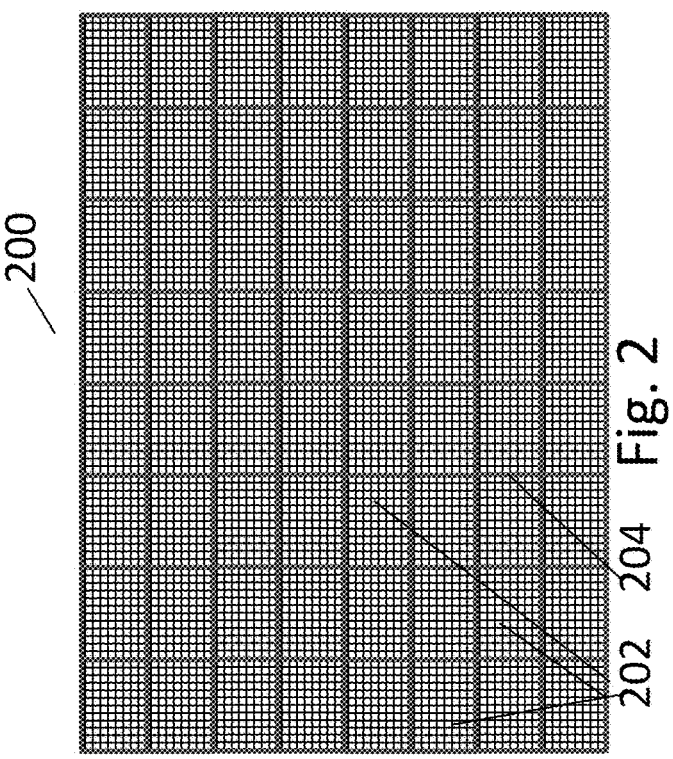
FIG. 2 is an example illustration of a memory structure having memory units laid out in a 2D repeating pattern.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by any appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

The use of layer transfer in the construction of a 3D IC based system could enable heterogeneous integration where each of strata may include one or more of MEMS sensor, image sensor, CMOS SoC, volatile memory such as DRAM and SRAM, persistent memory, and non-volatile memory such as flash and OTP. Such could include adding memory control circuits, also known as peripheral circuits, on top or below a memory array. The memory strata may contain only memory cells but not control logic, thus the control logic may be included on a separate stratum. Alternatively, the memory strata may contain memory cells and simple control logic where the control logic on that stratum may include at least one of decoder, buffer memory, sense amplifier. The circuits may include the charge pumps and high voltage transistors, which could be made on a strata using silicon transistors or other transistor types (such as SiGe, Ge, CNT, etc.) using a manufacturing process line that is different than the low voltage control circuit manufacturing process line. The analog circuits, such as for the sense amplifiers, and other sensitive linear circuits, could also be processed independently and be transferred over to the 3D fabric. Such 3D construction could include "Smart Alignment" techniques presented in this invention or leverage the repeating nature of the memory array to reduce the impact of the wafer bonder misalignments on the effectiveness of the integration.

In patents such as, for example, U.S. patent application Ser. No. 15/173,395, layer transfer techniques called ELTRAN (epitaxial layer transfer) are presented and may be part of the formation process of a 3DIC. The ELTRAN technique utilizes an epitaxial process or processes over porous layers. Alternatively other epitaxial based structures could be formed to support layer transfer techniques by leveraging the etch selectivity of these epitaxial layers, such as the very high etch selectivity of SiGe vs. Silicon, and variations such as Silicon (single crystal or poly or amorphous), SiGe (mix of silicon and Germanium), P doped silicon, N doped silicon, etc. Alternately, these layer(s) could be combined with types of detachment processes, such as 'cold splitting,' for example the Siltectra stress polymer and low temperature shock treatment, to provide a thin layer transfer process.

Recently it become a very attractive concept for processing gate all around horizontal transistors and has become the target flow for next generation devices such as the 5 nm technology node. Some of the work in respect to selective etching of SiGe vs. silicon has been presented in a paper by Jang-Gn Yun et al. titled: "Single-Crystalline Si Stacked Array (STAR) NAND Flash Memory" published in IEEE TRANSACTIONS ON ELECTRON DEVICES, VOL. 58, NO. 4, April 2011, and a more recent work by K. Wostyn et al. titled "Selective Etch of Si and SiGe for Gate All-Around Device Architecture" published in ECS Transactions, 69 (8) 147-152 (2015), and by V. Destefanis et al. titled: "HCl Selective Etching of Si1-xGex versus Si for Silicon On Nothing and Multi Gate Devices" published in ECS Transactions, 16 (10) 427-438 (2008), all of the forgoing incorporated herein by reference. Since the SiGe over Si substrate process is becoming mature, this facilitates using a SiGe layer as a sacrificial layer for production worthy 3D layer transfer.

In at least U.S. Pat. No. 8,669,778, incorporated herein by reference, in respect to at least FIG. 22, a technique to have a generic memory array such as SRAM, DRAM, FRAM, RRAM, or MRAM customized for specific applications and be integrated as part of a 3D device flow was presented. In at least U.S. Pat. No. 9,021,414, incorporated herein by reference, flows and techniques to adapt an electronic design automation ("EDA") tool for such a 3D structure are presented. In at least U.S. patent application Ser. No. 16/558,304, incorporated herein by reference, in respect to FIG. 21A to FIG. 25J, technique(s) to have a generic memory array integrated with logic utilizing hybrid bonding as part of a 3D device flow were presented. Herein a further variation of these concepts is presented. The 3D device could include a custom design logic level for which a memory level is integrated by use of a 3D integration using, for example, hybrid bonding. The memory level could be made fully custom to match the underlying custom logic, or by using a generic memory level, as presented herein, which has been customized by few added step to match the underlying custom logic. The memory level could be formed as an array of units in which the units are an array of bit-cells. The underlying custom logic could include the memory control circuit such as decoders and sense amplifiers.

In the following memory stacking alternatives, a few considerations are considered as important drivers. First, the objective is to maintain or minimize overall investment in using the memory stacking for custom devices. Accordingly, the memory array could be designed as a generic structure to be customized by very few custom steps, such as one or two metal layers and their associated via layer(s). Second, the generic memory structure uses conventional and simple copper interconnects which are usually defined by Chemical Mechanical Polishing-"CMP", and not etching. In other words, the generic memory structure could be supplied by dedicated suppliers such as a semiconductor foundry and the generic memory structure can be purchased and customized by many customers and according to their demand at reduced cost for masks and other non-recurring costs ("NRE").

Accordingly, the generic memory structure could be designed as an array of units. Each unit could be a small two-dimensional array of bit cells in the wafer plane. Later, if a product or customer requires a higher bit-cell density than the bit-cell density of a 2D single die, multiple generic memory wafers could be stacked to form a 3D stacked generic memory structure. As the identically designed and processed generic memory wafers are stacked, the memory unit is repeated in the vertical direction or along the out of wafer plane. Typically the number of rows in a unit could range from 32 to 1028 and the number of columns in the unit could range from 32 to 1028. In order to provide the flexibility and versatility to the customer with minimally compromising the cost, power, and performance, relatively smaller unit sizes such as 32×32 or 64×64 may be favored rather than the unit sizes such as 512×512. Herein, the smallest size of the unit will be referred as a 'primitive unit'. If the generic memory wafer shall be considered for the 3D stacked generic memory wafer, the neighboring primitive unit could have some additional space for through silicon vias or through layer vias. The customization in terms of the memory unit size could be offered by adding a few custom process steps on top of the generic memory wafer before the wafer stacking step. The customization step could be an additional metallization step processed on the generic memory wafer, which bridges and stitches a few units into the desired size of the memory structure. The multiple primitive units stitched together to form a target size will be referred as a 'stitched unit'. For example, four units of 32×32 primitive units can be connected to form a 64×64 stitched unit. In addition to the stitching process, a pin pad formation step could be included as part of these extra metal customization process steps. Then the customized memory wafer could be flipped and bonded, using for example hybrid bonding, to the logic substrate and form connections to pre-defined pads at the logic substrates connecting the memory to the logic.

The smallest memory structure could be designed with consideration of the bit-cell size and the precision of the hybrid bonding defining the minimum pitch and size for the bonding pads. The unit could be designed according to such a smallest memory structure or even smaller allowing more flexible placement and grid granularity.

Let's consider a bit-cell having width W and length L of total area W*L. Let's assume a hybrid bonding process with minimum pitch of H representing area for one connection H*H, wherein the area for one connection includes actual pad and space for the bonding. Let's assume the memory to be a 6T SRAM having one wordline for each cell width and two bit-lines for every bit-cell length. Let's assume the minimum array to have m cells along its width and n cells along it length. Accordingly the following formula represents the requirement for such a structure:

$$m*W*2n*L>=m*H*H+n*H*H$$

As we can see the number of pads, and accordingly the required area for the pads, are growing according to m+n while the unit array area is growing by m*n. Accordingly given specific numbers and a choice of aspect ratio, a minimum array size could be defined for a specific case of bit-cell and with a hybrid bonding process.

As an example, recent reports on hybrid bonding, such as by: Jouve, A., et al. "1 μm pitch direct hybrid bonding with <300 nm Wafer-to-Wafer overlay accuracy." 2017 IEEE SOI-3D-Subthreshold Microelectronics Technology Unified Conference (S3S). IEEE, 2017; and Global Foundries press release of Aug. 7, 2019 titled "GLOBALFOUNDRIES and Arm Demonstrate High-Density 3D Stack Test Chip for High Performance Compute Applications, indicate a hybrid bonding of 1 micron pitch (H=1 micron).

Figure 1:
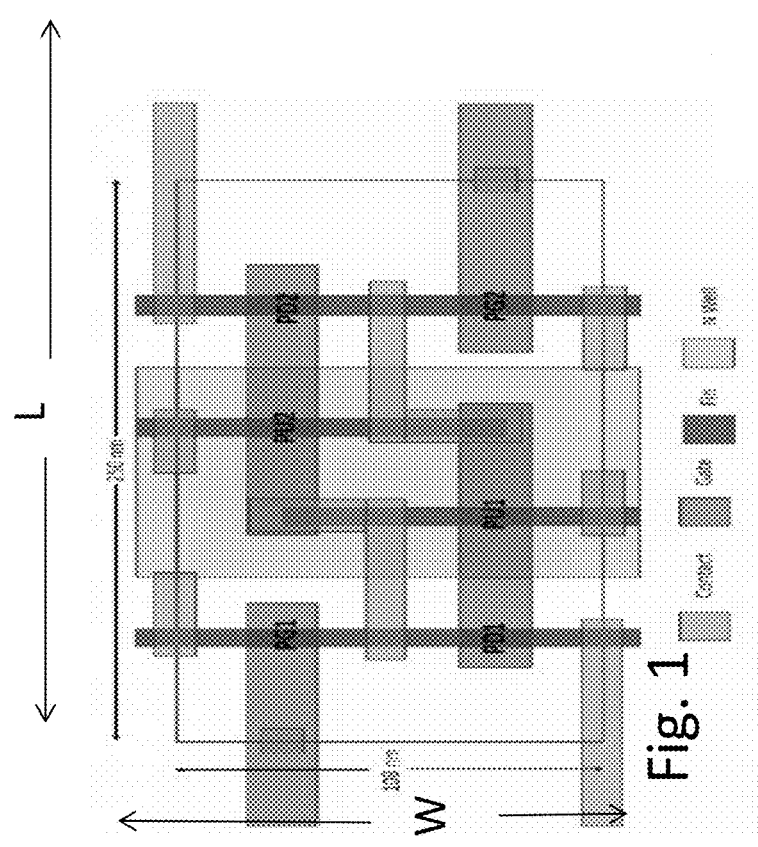
FIG. 1 is an example illustration of a 7 nm 6T SRAM bit-cell layout.

An example of a 7 nm 6T SRAM bit-cell layout is illustrated in FIG. 1 showing a W=108 nm and L=250 nm. Following the above formula and an approximately square memory structure, the smallest memory structure that could be used for hybrid bonding could have:

$m\sim 100$ and $n\sim 85$.

FIG. 2 illustrates such an exemplary memory structure having primitive units 202 which for such an example could be set as the minimum array having an ~100*85 bit cell. The units could be placed with a bit-cell size space 204 between them forming a two dimensional repeating pattern 200 of generic memory.

FIG. 3A illustrates four units 202 of the array of units such as in FIG. 2. These four units are arranged in a 2×2 configuration example.

FIG. 3B illustrates the four generic units 202 being customized to function as a memory structure by forming 'bridges' 304 (or strapping connections) between them such that the wordlines and the bitlines are connected so to control the 2×2 memory structure. The bridges connect the word-lines and bit-lines of adjacent units. The bridges could be copper, tungsten or other conductive metal or conductive material which is as conductive as copper or better.

FIG. 3C illustrates the further customization example attained by adding pads or pins 306 in preparation for the following step of hybrid bonding. The pads or pin could be copper, aluminum or other metal. The pad or pin 306 layer can be processed at the same step of the bridge layer. Alternatively, the pad or pin 306 layer could be formed on an upper level compared to the bridge layer so when the pad and pin 306 layers are exposed, the bridge layer resides inside the dielectric layer.

FIG. 3D illustrates the extension of the structure showing an additional 2×2 memory structure (for a total of two 2×2 memory structures) and the space 308 between them without bridges. Each 2×2 memory structure has four generic units 202 in this example.

FIG. 4A illustrates a cut view in the area marked by ellipse 322 of FIG. 3A. FIG. 4A shows a gap 450 in memory control line 402. Memory control line 402 could be a bit-line or a word-line, or in some cases another type of memory control line. The memory control line 402 is extended outside of the outer boundary of bit cell array.

FIG. 4B illustrates a cut view in the area marked by ellipse 302 of FIG. 3C. FIG. 4B illustrates bridge 404 with vias 409 linking the gap 450 and connecting the control line 402 of one unit 202 with another control line 402 from another unit 202. Pad/pins 406 and 408 show potential conductive hybrid bonding spots. Exemplary via 407 [for example, a thru silicon via (TSV) or a through layer via (TLV)] may connect pad/pins 406 to an underlying control line within an exemplary unit 202. As well, an electrically conductive connection from a pad/pin 408 thru via 407 to another control line 410 coming from the edge is further illustrated in FIG. 4D.

FIG. 4C illustrates a cut view in the area mark by ellipse 312 of FIG. 3D. The figure illustrates vias 412 connecting the control line 404 from the unit edge with wire 414 and vias 407 and 412 to the pad/pin 406 for future bonding. FIGS. 4A, 4B and 4C illustrate a portion of the edge of generic units 202 and are exemplary in nature. Engineering design choices may create many variations of the connectivity concepts presented herein to optimize speed, power and cost of the envisioned system/device. For example, the pad/pin, via, control line segments, etc. shown in FIGS. 4A-4C do not need to be symmetric with respect to gap 450. Each portion of units 202 may have a completely different connectivity. As well, the connections between units 202 may be programmable, for example, by laser blowing or fusing fuses, or may be electrically programmed to be a conductive connection by an anti-fuse, or non-conductive by a fuse.

Figure 5A:
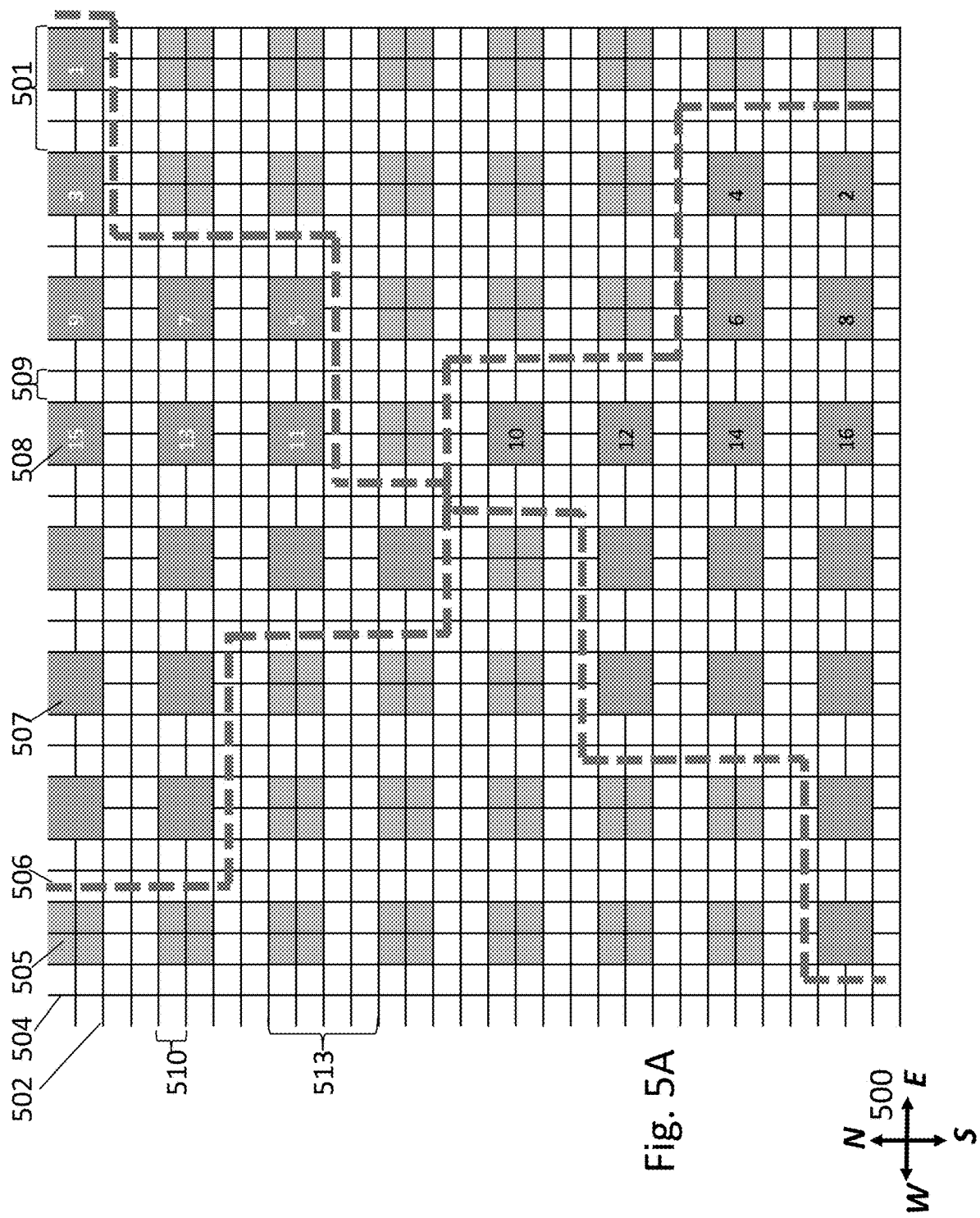

FIG. 5A-5C illustrates an example of a memory unit with a 3D pin/pads connectivity structure which is using two metal layers and a pin/pads layer.

FIG. 5A illustrates the pin/pads layer on top of a grid illustrating the underlying bit-lines 502 having pitch 510 ("BLP"), and word-lines 504 having pitch 509 ("WLP"). The hybrid bonding pin/pad pitch is 501 in W-E direction and 503 in the N-S direction, about 4 times courser than BLP and WLP, The fundamental concept is to re-distribute control lines which may have a tight pitch requirement into a two-dimensional metal pad array in a larger pitch to accommodate the hybrid bonding capability. In this example the bit-lines are the memory top metal in W-E cardinal 500 direction and the word-lines underneath in N-S cardinal 500 direction. In this example the memory cell size is about 2×BLP*WLP–two grid square if complementary cells requiring BL and BL/ such as SRAM or about BLP*WLP– one grid square if the cell has only one BL such as DRAM, MRAM, PRAM, or RRAM. For simplicity, one grid squared is assumed to be one grid square for forthcoming explanation. The bonding alignment suggests a pad/pin of about two BLP by two WLP or 2×2 grid square 505, 507 which suggests a total area for one pad/pin of a 4×4 grid square. In other words, the one pad/pin occupies 16 bit cell areas; 4 bit cell areas of pin/pad and 12 bit cells are needed for space. In this example each memory cell has one word-line and one bit-line, such as is found in DRAM bit cells. The calculation for the minimum unit size could be adapted to other type memory cells accordingly as in the following. For this example the unit aspect ratio is about one-square unit. The BLP is about the same as WLP or P for the following calculation. Accordingly the area for one pin/pad is 4×4× $P^2=16P^2$, the number of word-lines could be equal to the number of bit-lines or m for a square unit structure, than the formula suggests:

$16P^{2}*(m+m)<=mP*mP$, or $32<=m$.

Accordingly the example of FIG. 5A illustrates a smallest unit of 32 bit-lines by 32 word-lines.

FIG. 5A illustrates 32 pin/pads 507 for the bit-line connectivity for which the first 16 bit-line addresses are numbered 508, and 32 pin/pads 505 for the word-line connectivity. It also illustrates with dashed lines 506 allocating the top surface to four zones, two for the pin/pads for the word-line connectivity and two for the bit-line connectivity. The specific pin/pad arrangement of FIGS. 5A-5C are exemplary, and specific arrangements may be designed according to engineering tradeoffs such as lithographic and bonding alignment accuracy and precision, critical speed nets, memory cell size and aspect ratio, etc.

FIG. 5B illustrates metal connection of the bit-lines. There is connection between each bit-line to one corresponding pin/pad. The connections are split into two groups. The even numbered 526 bit lines which are connected from the South using side via 516 while the odd numbered are from the North side. This leverages the availability of each bit-line on both sides of the unit. The connectivity layout is only an illustration. A qualified layout could be designed by a layout artisan in the art taking into account the design rules for the specific process. Such a layout could include extending the unit size to accommodate lay out limitations in such specific cases. In FIG. 5B the top metal is allocated to the pad/pins 522, 524. Connected with via 520 to the underlying metal layer 514 oriented W-E, connected with via 518 to the metal layer underneath 512 which is oriented S-N in FIG. 5B.

The connectivity layout (not shown) for the bit-line could be made in a similar fashion in the area left for it, or leverage the availability of the bit-lines oriented W-E being at the top of the memory array using direct vias rather than West, East side's access vias.

FIG. 5C illustrates the top three connectivity layers of FIG. 5B without the grid, for better visibility of the word-lines pin/pad connectivity lay out. The drawing symbol legends between FIGS. 5B and 5C are the same.

Although not drawn, many memory bit cells require power and ground lines, for example, such as SRAM. It should be understood that the bonding pad for the power and ground are allocated on top of bridge region 304 of Fig. The power and ground lines are often biased at static voltage without row or column individually control, the power and ground lines from multiple rows or columns are grouped together so only a few pads would be required.

The top surface of the logic wafer would have a pad/pin layout which is reciprocal to the memory wafer or die. The pad layout for the logic wafer and the memory wafer would be mirrored so that they can be properly F2F bonded and electrically connected later. The pad/pin of the logic wafer would be connected to the sense amplifier for bit-line and multiplexer for word-line pad.

Figure 5D:
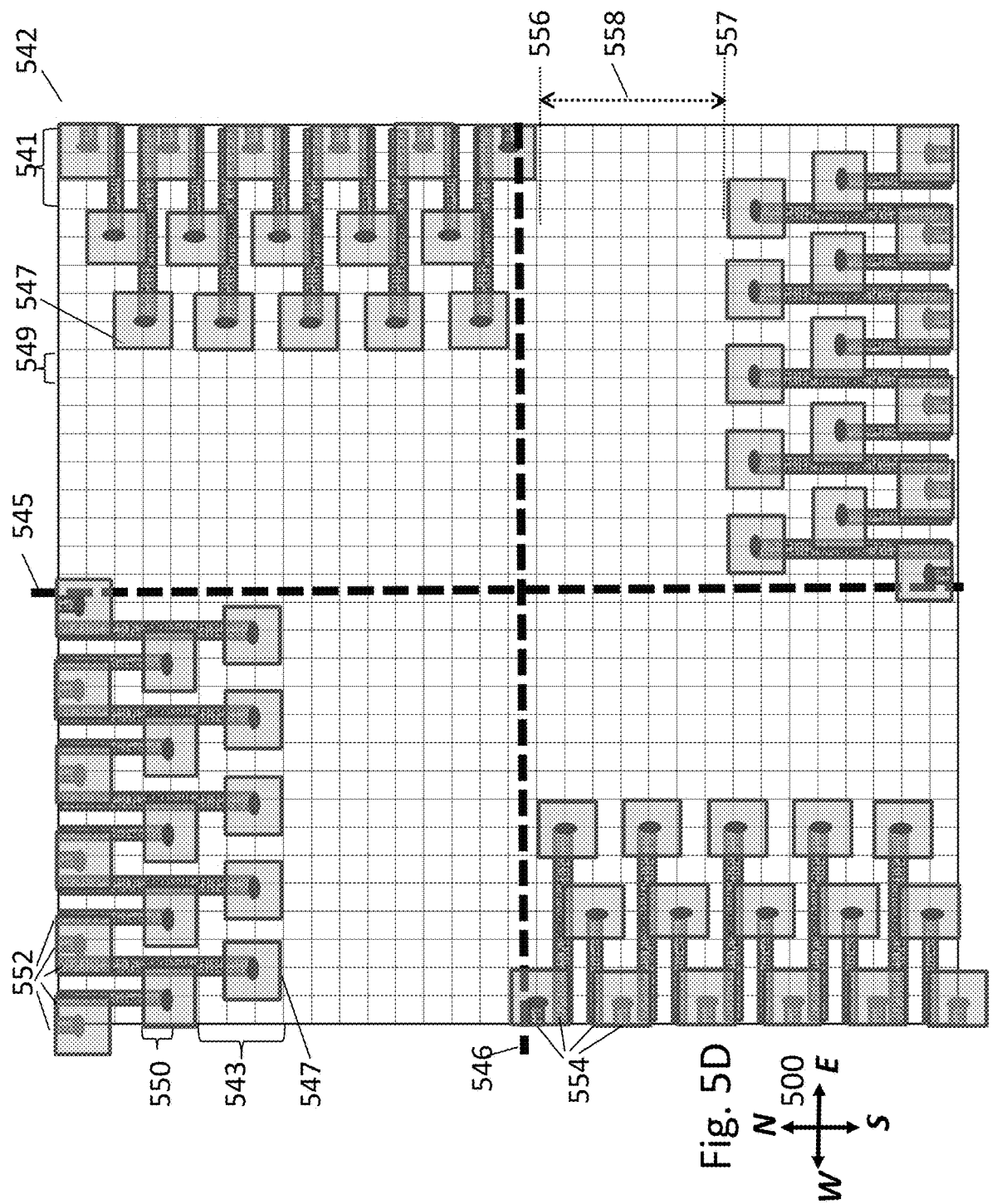

Another alternative is to have a bit larger unit size to allow a regular pin/pad over the unit connectivity. Such could allow one metal layer for the routing and another one for the pin/pads layer. To illustrate this alternative, the unit structure of FIG. 5A and with better hybrid-bonding pitch ("H") as is illustrated in FIG. 5D. The bonding pad pitch 541, 543 including pad/pin 547 is, for example, three times larger than the wordline pitch WLP 549 and the bitline pitch BLP 550 of memory array. The hybrid bonding connectivity structure resemble the one referenced in PCT/US2017/052359, incorporated herein by reference, as related to its FIG. 21A-21C, folded over the memory unit as is illustrated in FIG. 5D herein. The ratio, H/BLP, between the hybrid bonding pitch H and the bitline pitch BLP, could derive the number (rounding up) of columns of bonding pad/pin for the bitlines as is illustrated in FIG. 5D. Similarly, the ratio H/WLP, between hybrid bonding pitch H and the wordline pitch WLP, could drive the number (rounding up) of rows bonding pad/pin for the wordlines as is illustrated in FIG. 5D. As a result, the number of rows and columns for WL and the number of rows and columns for BL are respectively determined. So the top surface of the unit could be marked to four similar size quadrants by the N-S dashed line 545 and the W-E dashed line 546. The N-E quadrant 542 could be used for bonding pads/pin for half of the bitlines 554 while the W-S could be used for bonding pads/pin for the other half of the bitlines 554, and in similar way for the wordlines 552, W-N quadrant for the first half and the S-E for the other half.

Figure 5E:
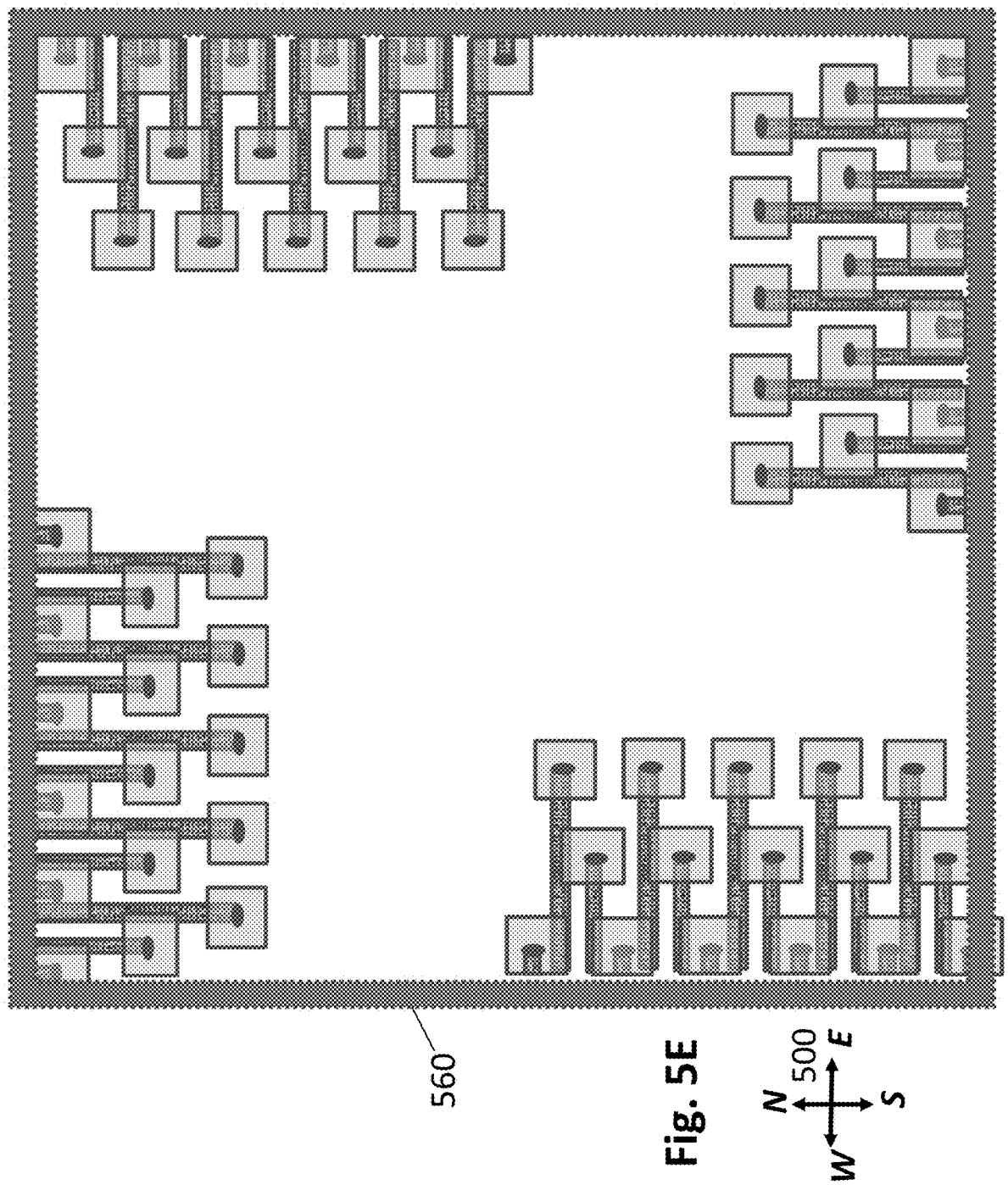

To assess what could be the smaller unit size for such pin/pads connectivity, the following considerations could be addressed. The dashed line 556 represent the South direction edge of the N-E quadrant structure, while the dashed line 557 represent the North edge of the S-E quadrant connectivity structure. The distance between these structures 558 is required to avoid these structures getting too close. The length (in N-S direction) of the N-E quadrant structure is about ~n/2*BLP+H. In here, n is the number of bitlines in the unit. The width (in N-S direction) of the S-E quadrant structure is about ~H/WLP (round up)*H. For simplicity, let's assume that the wordline pitch is about equal to the bitline pitch and could be symbolized as P. The unit size in N-S direction is about n*P. Accordingly the formula representing the condition regarding 558 is: $H/P*H+H+n/2*P<n*P$ which could be written as: $n>2H^2/P^2+2H/P$. For example, let's assume H=1 micron and P=0.1 micron than n>220. Accordingly a memory array that is structured as array of units sized 200μ*200μ with a control lines pitch of 0.1μ would have enough top of the unit area to form a pin/pads connectivity structure such as illustrated in FIG. 5D having n~2,000>>220. FIG. 5E is the illustration of FIG. 5D after removing the grid and other marks and adding marks for the borders of the underlying memory unit 560

Figure 6:
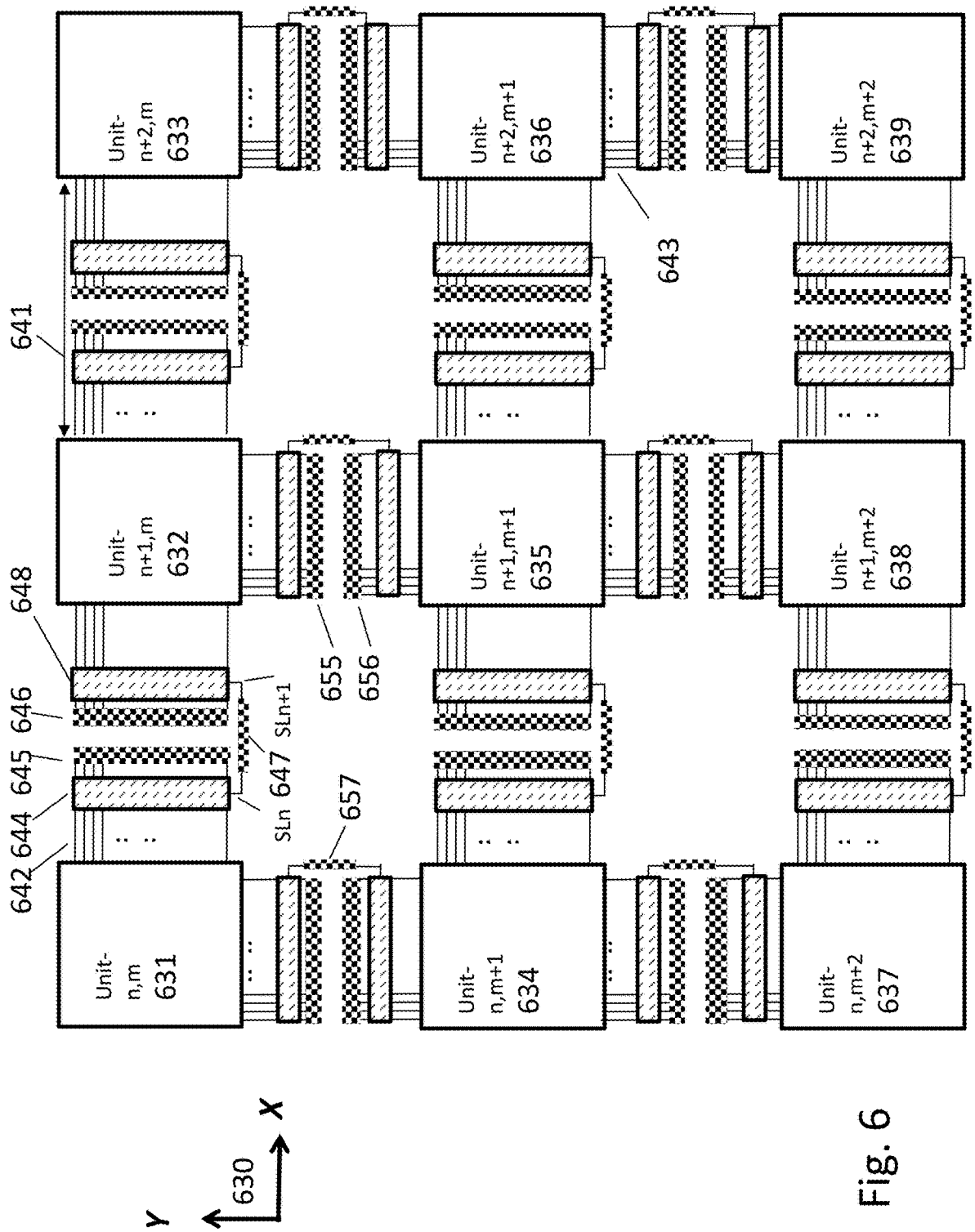
FIG. 6 is an example illustration of extending the memory layout concept to a multi-level memory structure.

FIG. 6 illustrates extending the concept to a multi-level memory structure. Such could be utilized in cases in which the memory requirements are very high and a single level of memory would not offer enough memory. FIG. 6 is similar to FIG. 22F of U.S. application Ser. No. 16/558,304 incorporated herein by reference. The vertical pillars of the global control lines such as 2246 and 2258 of FIG. 22F (of Ser. No. 16/558,304) are replaced with two sets of vertical pillars 645, 646 as replacement of 2246, and 655, 656 as replacement of 2258, and so forth. And the bridging concept of FIG. 4B or the pad/pin extension for bonding of FIG. 4C could be used for the customization of multi-levels memory structure. The per-level selects 647, 657 could be connected to the control logic to enable full control of the specific level selected.

FIG. 7A is a copy of FIG. 43E of U.S. application Ser. No. 16/558,304, incorporated herein by reference. FIG. 7A illustrates a multi-level device that could comprise, logic levels, customize memory levels as presented herein to support such logic level as cache 1, cache 2 or last level cache type memory, additional levels of memory and levels of memory controls including decoding and sense amplifier circuits, these levels could be in the form of multi-level stacks of high speed memory such as DRAM, memory structures such as 3D NOR and storage structures such as 3D NAND. Additionally, the level(s) of global X-Y interconnection could utilize electromagnetic waves over transmission lines or wave-guides with the supporting RF or optical circuits. The various levels could include feed through connections to allow across level vertical connectivity. The use of layer transfer in the construction of such a 3D IC based system could enable heterogeneous integration wherein each strata/layer/level may include, for example, one or more of MEMS sensor, image sensor, CMOS SoC, volatile memory such as DRAM and SRAM, persistent memory, Ferroelectric Memory and non-volatile memory such as flash and OTP. Such could include adding memory control circuits, also known as peripheral circuits, on top or below a memory array. The memory strata may contain only memory cells but not control logic, thus the control logic may be included on a separate stratum. Alternatively, the memory strata may contain memory cells and simple control logic where the control logic on that stratum may include at least one of decoder, buffer memory, sense amplifier. The peripheral/control circuits may include the charge pumps and high voltage transistors, which could be made on a strata using silicon transistors or other transistor types (such as SiGe, Ge, CNT, etc.) using a manufacturing process line that may be, and often is, different than the low voltage control circuit manufacturing process line. The analog circuits, such as for the sense amplifiers, and other sensitive linear circuits could also be processed independently and be layer transferred over to the 3D fabric. Such 3D construction could include the "Smart Alignment" techniques presented in this invention or incorporated references, or leverage the repeating nature of the memory array to reduce the impact of the wafer bonder misalignment on the effectiveness of the integration. Such as presented in PCT/US2017/052359 (WO2018/071143), incorporated herein by reference in its entirety. Specifically for this discussion, in respect to its FIG. 11A to FIG. 12J, or using hybrid bonding techniques as presented in respect to its FIG. 20A to FIG. 25J. Hybrid bonding between levels reduces the process steps required in such a 3D integration but provides less flexibility for overcoming the misalignment challenge. "Smart Alignment" techniques allow overcoming such alignment challenges but will require via etches and deposition steps for such levels adding steps to the stacking process. The vertical connectivity challenge could be quite different between the various levels in the 3D stack structure. Stacking memory levels which have no in-level decoders could require vertical connectivity at word-lines, bit-lines pitch and so forth to the decoder's level, which is relatively more demanding than the connectivity of other levels in the stack. Accordingly the stacking process could be different to accommodate the alignment requirement between these levels. Also the source of alignment error could be different making the error sometimes smaller if the wafers are coming from the same process lines such as could be expected for the memory levels (for example, minimal stepper matching). These choices and the 3D engineering design could use the various 3D integration techniques presented herein the incorporated by reference art by an artisan in the art.

The memory strata could include multiple types and memory technologies and could be placed in various levels of the 3D device structure such as is illustrated in FIG. 7A. It could include high speed memory closer to the computing logic and high density memories closer to the X-Y interconnection fabrics. The high density levels could be in the form similar to what is known in the industry as 3D NAND, V-NAND, X-point memory, or Optane, while the high speed memory could be similar to what is called 3D NOR-P and presented in PCT/US2018/016759 and 62/952,222, both incorporated herein by reference. The memory stratum could be a structure of arrays of units. FIG. 7B illustrates such unit which could have a size of about 0.04 mm$^2$, about 0.1 mm$^2$, about 0.4 mm$^2$, about 0.1 mm$^2$, about 0.4 mm$^2$. Or even larger than about 1 mm$^2$. It could a structured array of units such as 2×2, 4×4, 8×8, 32×32, 256×256, 1024×1024 or any mix of these numbers such 16×64. The memory level could include the memory control circuits 710, 714 also called memory periphery circuits and about 100 feed-through per units 718 to support vertical connectivity throughout the 3D structure 700. The control circuits could be structured so that each memory unit has its own control on top 710 and/or below 714 the memory array 712. The connectivity between the memory control and the memory array could utilize hybrid bonding and pad/pin structure as been presented here in reference to FIG. 5A-5C or other structures such as been presented in the incorporated by reference art such as in PCT/US2017/052359, incorporated herein by reference, as related to its FIG. 21A-21C. The connectivity from the control circuit 714 to the other device level such as computing logic 716 could be relatively easier as for an area of a unit there could be need for few tens or very few hundreds of connections needed as the memory control circuits include the address bus decoders. So within the units the connectivity needs from the memory control circuits to the memory array, 2D or 3D, could include a few thousand of connections to the bit-lines and the word-lines about a hundred of connection for the feed-throughs and few tens to a few hundred for the layer select in the case of 3D memory. The few hundred additional connections could be added on top of the unit or by it side as even for pad/pin with 1 micron pitch over a side length of a unit which is 200 microns or more will add only single percents of overhead area to the structure. The memory stratum could be a standard module to be integrated with other structures to form custom or semi-custom product. The structure size could be a full wafer or any smaller structure such as even a single field of even smaller than 100 mm$^2$ size, as presented in PCT/US2018/52332, incorporated herein by reference. The industry supports stacking with various type of bonding including hybrid bonding of wafers or dies. The memory controller could include build in test and redundancy activation to be operated during device set up and operation. The activation and reporting of these built-in test and redundancy could be included as part of the function of these hundreds of connections and feed-through connections.

The data bus for such a unit could be different for different units across the structure and so could be the size of the units in the structure. The data bus could be 1, 2, 4, 8, 16, 32 or 64 bits which are common in the industry but could also be an extreme wide data bus of few hundreds or even thousands of bits to support processor designs with an extremely wide data bus, or with additional on chip buffers to increase data speed from memory to processor level.

FIG. 7C illustrates tiling the unit structure of FIG. 7B thus forming an array of units 740. Such tiling could be across a full wafer or any portion of such. FIGS. 7A-7C are side-views along the X-Z 702 direction. FIG. 7D is a planar view along the X-Y 703 direction of a wafer sized array of units 704.

The process flow to form full 3D Heterogeneous integration such as is illustrated in FIG. 7A could include a few steps of wafer bonding and substrate removal such as been called "cut" using cut-layer or thinning using grinding and etch which could include using the cut-layer as an etch stop layer. This 3D structure formation could include mix and match bonding of various levels such as generic strata, semi-custom strata and full custom strata. The memory strata could include a step of forming a 3D NOR memory array and then bonding the memory control level to it. FIGS. 7E-7G illustrates such a process flow using a small section X-Z 702 cut view.

FIG. 7E illustrates a small section of the memory control circuit 739 (peripheral circuit). The section corresponds to the edge of two units. It illustrates four top bonding pin/pads 736,738 to be bonded to the memory pin/pads such as illustrated in FIG. 5E. It illustrates a feed through structure 735 and two bottom pin/pads 737 designated to be connected to the logic level. The base could include base silicon 742 and a cut-layer/etch-stop-layer 740. The bottom bonding pads could be placed in the region between units which could be cleared of active circuits. The bottom 737 pin/pads could be part of the first metal or the contact layer. Alternatively leveraging the etch selectivity of the cut-layer 740 they could be formed even below it (not shown) to simplify the later step of exposing them for preparing them as pin/pads. Other options do exist including allocating more area for these pins/pads and using a technique known as TSV. The structure includes top oxide 733 for protection and will be part of the future hybrid bonding.

FIG. 7F illustrates flipping and bonding the memory control circuit 744 (from FIG. 7E) on top of memory strata 743. The memory strata 743 could be an array 752 of 3D NOR-P or any of the other memory options previously discussed. Memory strata 743 could be formed over substrate 756 with its own cut-layer (also could be called etch-stop-layer) 752. The feed-through 755 could be placed between the memory units. The memory pin/pads 735,736, 738 from FIG. 7E could be connected to the control level pin/pads 750 using hybrid bonding.

FIG. 7G illustrates the structure after thinning the memory control circuit 744 to form memory control 745 by techniques such as grinding and etch-back leveraging the etch-stop layer or any of the other cut techniques previously presented herein or in the incorporated references. The pin/pads 758, 760 are exposed or being formed by opening the top via and forming the metallic top pin/pads using conventional semiconductor processes. FIG. 7G illustrates a small section of a full memory strata having the memory array and its control ready to be bonded on top of a logic wafer toward forming the type of structure illustrated in FIG. 7A. It could be expected that the number of connections from the memory control strata to the memory array 750 per unit could be few thousands to provide the control to the word-lines, bit-lines and other memory control lines. The number of feed-through 755, 758 per unit could be in the tens and so is the number of connections 760 to the processor logic level, as previously discussed.

The memory controller could be integrated using bonding techniques or by other techniques such as common with 3D NAND with periphery under cell ("PUC).

The memory strata could be set to function as dual port memory such for example one memory controller 714 is controlled by the underlying processing logic while the upper controller 710 may be controlled by an overlying processing circuit that could be part of the circuits operating to move data into the structure or out of the structure ("I/O").

The memory strata could be set to function as a content addressable memory (CAM).

The stacking could utilize pin/pad connectivity as presented in reference to FIG. 5A-5E or other techniques such as smart alignment and electronic alignment as was presented in the incorporated by reference art, or any mix and match of these techniques.

Figure 8:
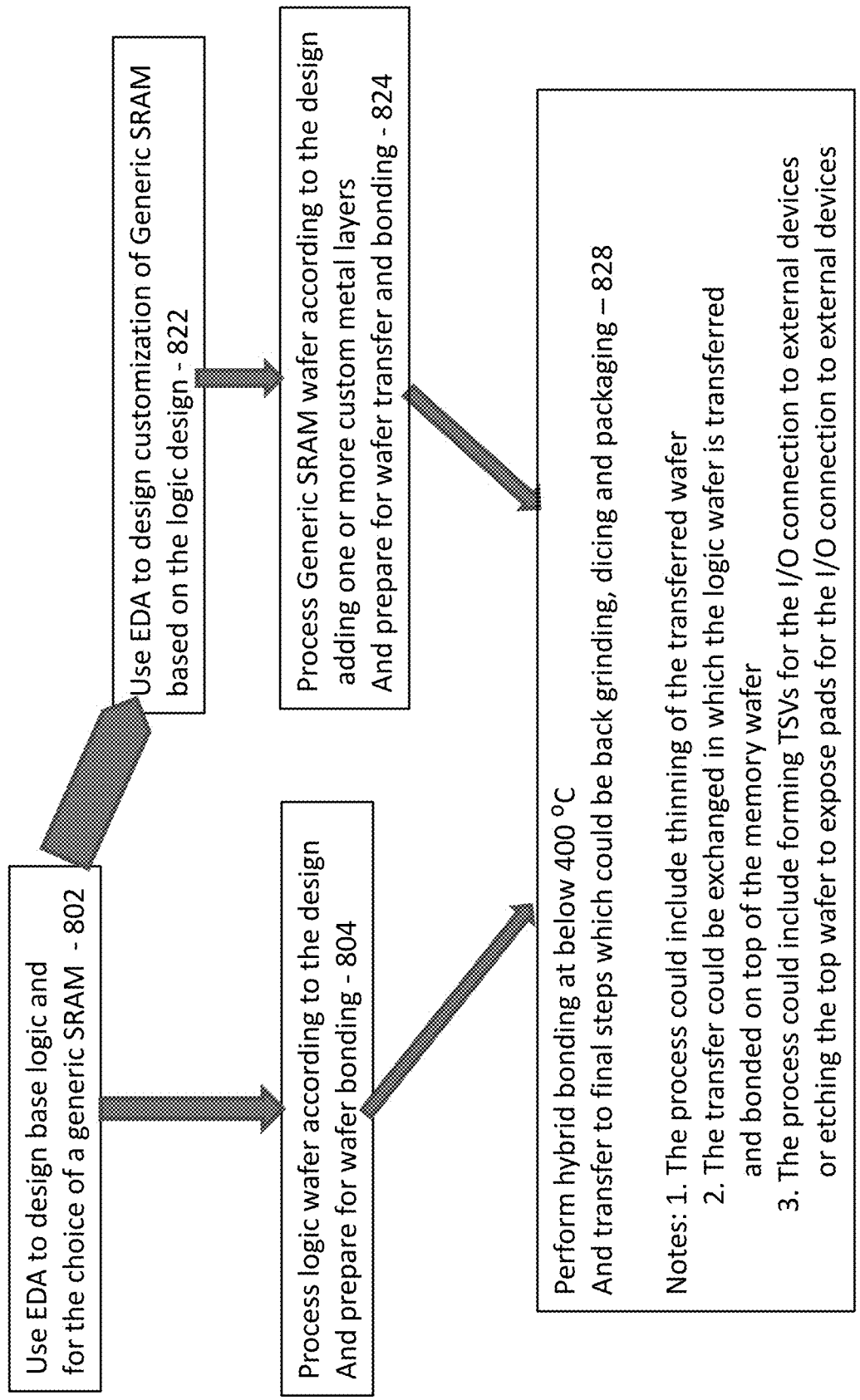
FIG. 8 is an example illustration of an overall process flow of designing the logic and memory.

FIG. 8 illustrates an exemplary overall process flow of designing the logic wafer 802 and processing it 804. Design the customization of the memory wafer 822. There might be full set of generic wafers offering multiple process nodes and other memory option such as high density and high speed and so forth for the designer to choose from. The selected generic memory wafer may then be customized 824 for the specific design and then flipped and bonded using, for example, hybrid bonding 828 to the logic wafer.

The logic wafer and the generic wafer structure could include power line connections using the hybrid bonding as well. These power connections could be made at the unit level memory structure level and or die level. The figures do not show these power connections. The final processing in this step may include back grinding, dicing and packaging.

The generic memory could be customized to support more than one level of memory using techniques presented in the incorporated by reference art.

The EDA tool for such a 3D logic-memory design could incorporate techniques presented in at least U.S. Pat. No. 9,021,414, incorporated herein by reference. For the flow presented in FIG. 8, the EDA tool could include a grid for the memory decoder placement to support such a unit based generic memory fabric.

There are many options to form 3D systems using techniques such as been presented herein or in the incorporated by reference art. These techniques could include adding pin/pads over the memory unit such as is illustrated in FIGS. 5A-5D. Such could include stacking a few memory levels one on top of the other forming a 3D memory strata formed by stacking memory levels which could be 2D levels or 3D levels which could be a multilayer memory, for example, such as 3D NAND or 3D NOR and so forth. Such 3D structures could include sharing global memory control lines common between levels and independent layers or level select signal. Such memory 3D structures could be controlled by one or a few memory control layers controlling each of the memory layers using the common memory control pillars and the individual layer selects. Such 3D strata formation flow is presented in reference to FIG. 9A-9F herein.

FIG. 9A illustrates an X-Z 902 cut view of a small region of the memory control strata similar to the one in FIG. 7E. The structure includes a substrate 912 with etch-stop layer 910 and memory control circuits 909. The memory control circuits 909 structure could include 'bottom' connections 904,907 in between units for future connection to the processor logic level, and feed-through 905. It also includes over the control circuits the pins/pads 906, 908 for the 'global pillars' of the memory control lines. The global memory control connections do not look like pillars as the keep folding over the top of the unit surface to accommodate the relatively low pitch associated with the hybrid bonding.

FIG. 9B illustrates an X-Z 902 cut view of a small region of a 3D memory 922 built over a substrate 926 with etch-stop 'cut-layer' 924. As well, the structure includes units feed-through 925 and over the unit bonding pins/pads 920.

FIG. 9C illustrates the structures after transferring the memory structure 913 over the memory control structure of FIG. 9A and removing the substrate 926 such as by grinding and wet and/or dry etch using the etch stop layer 924 for a controlled etch stop.

FIG. 9D illustrates the structures after adding in pins/pads 928 over the 3D memory 922 units using a layout such as illustrated in FIG. 5A-5E.

Figure 9F:
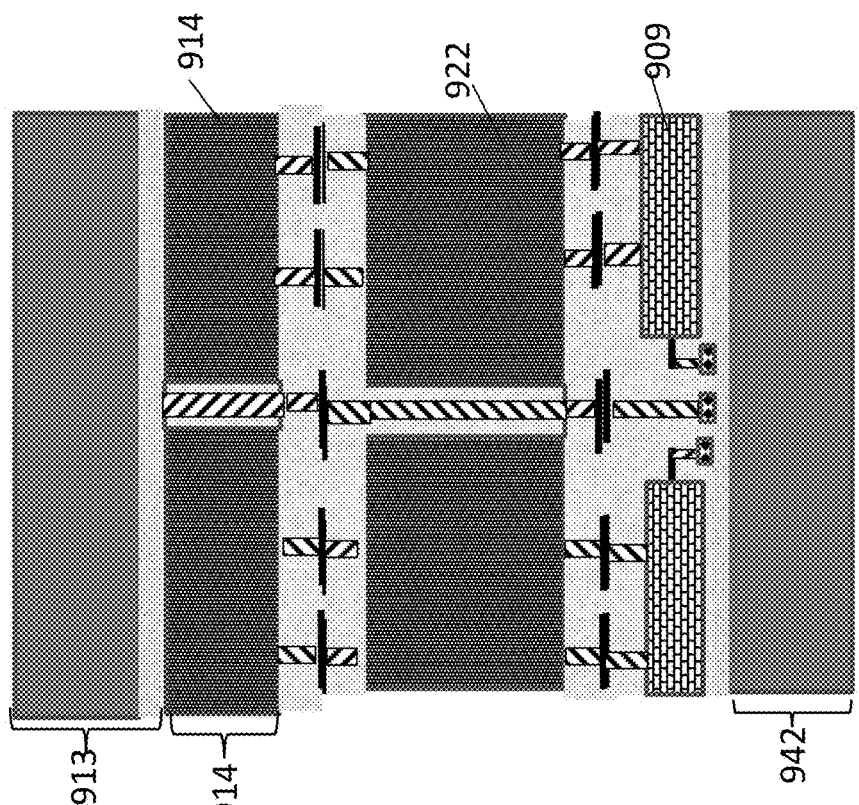
Figure 9E:
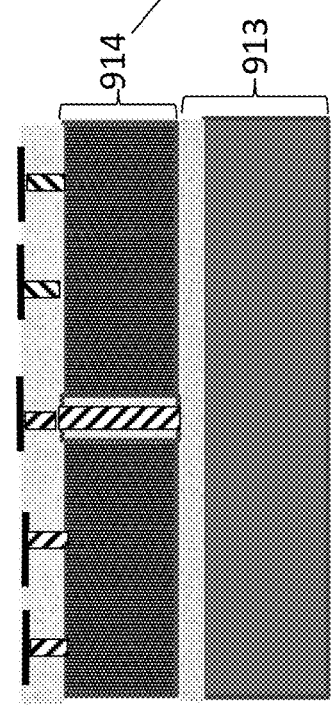

FIG. 9E illustrates an X-Z 902 cut view of an additional small region of memory 914 built over a substrate with an etch-stop 'cut-layer' in between the units' feed-through and over the units' bonding pins/pads.

FIG. 9F illustrates the structure after transferring the 3D memory structure 914 over the structure of FIG. 9D, using hybrid bonding connecting the respective memory control lines such as wordlines, bitlines and so forth, and connecting the feed-through. Accordingly the memory control circuits 909 could be used to control the overlaying memory units of the first strata 922 and the overlaying memory strata 914. The memory strata could be designed with the same memory unit size and the same number of memory control lines and utilize a standard pin/pads layout to enable such system level integration using hybrid bonding. These memory strata could be 2D memory array or 3D memory array. They could be of very similar memory technology or in other cases different memory technology. The memory control could be 2D structure or a 3D structure. Many variations of mix and match could be constructed. As was discussed before the use of global bitlines in a 3D structure needs a control of the level select. Such level control needs to be properly connected in the memory control circuits 909. There are few options to do so such as:

A. Have an individual strata-select with direct connections to the memory control circuits. In such case the internal level select could be connected to a global level select connected to the memory circuits.

B. Each memory strata could have dedicated connections for its level select. It is expected that the number of level selects could be could be less than 100 so allocating area for pin/pad for each of them would be reasonable area overhead.

C. In a case that the objective is to stack the same type of memory strata multiple times then a good choice would be to use the technique presented in respect to FIG. 22A-22B of PCT/US2017/052359, incorporated herein by reference.

Figure 9G:
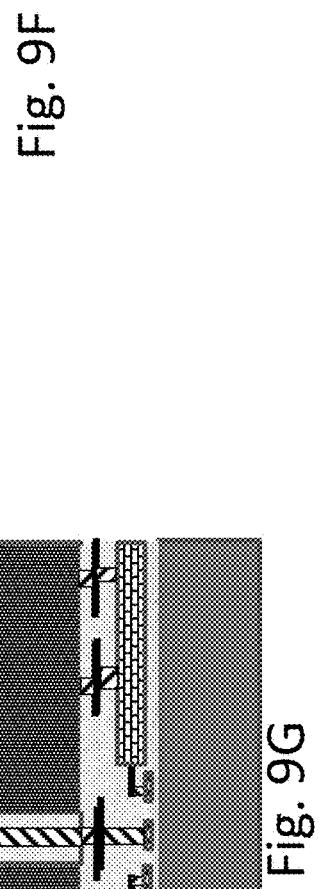

FIG. 9G illustrates the structure after removing the top substrate 913, adding pins/pads and repeating the flow by adding more memory strata 934, 932, 930. So the structure could include a carrying substrate 942, memory control strata 940, first 3D memory strata 938 and stack of four memory stratum 930, 932, 934, 936. The structure of FIG. 9G could be used as a memory building block to be integrated with computing logic strata to form a 3D computing structure.

One of the challenges for 3D system having multiple levels of active devices is power delivery. The concept of heterogeneous integration could be extended to include substrate design to support power delivery. FIG. 10A, a vertical cut view 1002, illustrates a substrate similar to the one illustrated in FIG. 7A with added global power delivery structures. Such could include deep trenched capacitors 1016 and power distribution network ("PDN") 1014. The deep trench capacitor can be formed inside a silicon wafer. In this case, the silicon substrate 1001 would be heavily doped to form a bottom electrode of the trench capacitor as shown in FIG. 10A. Alternatively, the deep trench capacitor can be formed within the oxide. In this case, a bottom electrode is can be a metal liner (not drawn). The structure of capacitor can be one of planar type, crown type, pillar type, or cylinder type. In cylinder type, the top plate electrode can be heavily doped (such as phosphorous or boron doped) polysilicon or silicon germanium. One side of capacitor electrode 1014A would connect ground/power line and another side of capacitor electrode 1014B would connect power/ground line. This could be formed using one thick metal layer, or multiple metal layers. Integrating trench capacitors in the PDN could be an effective way to reduce local voltage variation resulting from the circuits operation. FIG. 10B illustrates the structure after adding on the various levels of logic, memory, EM interconnect levels, and IO level as was illustrated in FIG. 7A. Such could include hybrid bonding and multiple steps of level transfers.

Another embodiment of this invention is to integrate inductor for power delivery network. Such could include MEMS or CMOS-BEOL based inductor 1017 can be an air, oxide, iron, or ferrite. When ferrite core is being used, the core material can be manganese-zinc, nickel-zinc, iron-silicon, or iron-silicon-aluminum. A structure of the inductor can be spiral type, thin film. One side of inductor electrode 1014A would connect ground/power line and another side of inductor electrode 1014B would connect power/ground line as shown in FIG. 10C. The core material of the inductor 1017, FIG. 10D illustrates the structure after adding on the various levels of logic, memory, EM interconnect levels, and IO level as was illustrated in FIG. 7A. Such could include hybrid bonding and multiple steps of level transfers.

Another embodiment of this invention is to integrate both capacitors shown in FIG. 10A and inductor shown in FIG. 10C simultaneously for power delivery network Level transfer and hybrid bonding may need special interconnect layer for the formation of pad/pins as illustrated in FIG. 5A-5E. Forming such structure underneath the active circuit could require first to perform a level transfer and substrate removal as is for example illustrated in FIG. 9B-9D. Wafer processing costs is highly dependent on the type of process line used as is illustrated in the table of FIG. 11. The table of FIG. 11 was published in April 2020 in a report titled "AI Chips: What They Are and Why They Matter, An AI Chips Reference", Authored by Saif M. Khan, Alexander Mann, incorporated herein by reference. It shows order of magnitude cost and price difference from 90 nm line to 5 nm process line. Accordingly it might be useful to construct special coupling level which could include electronic alignment capabilities similar to those presented in reference to FIG. 1A-FIG. 3C, of PCT/US2018/052332, incorporated herein by reference. Such coupling level could help building a heterogeneous integrated 3D system in which a memory level could in between unit bottom pins similar to 907 of FIG. 9A and over the units top pads such as 906, 908. Using the coupling level the in between units pins 907 could be coupled to over the circuits pads structure like the one illustrated in FIG. 5A, just using hybrid bonding.

A 3D system like 700 could be constructed with all of the level been custom made for that specific system or with many of the levels being generic utilizing an agreed standard for pin/pads location and units size. Accordingly the coupling level could be made to comply with such 3D heterogeneous integration standard. In some cases the over the circuit pin/pads location could be part of a standard while the in-between units pin/pads or control line could be left custom to better fit the specific memory or other type of circuit technology.

Figure 12A:
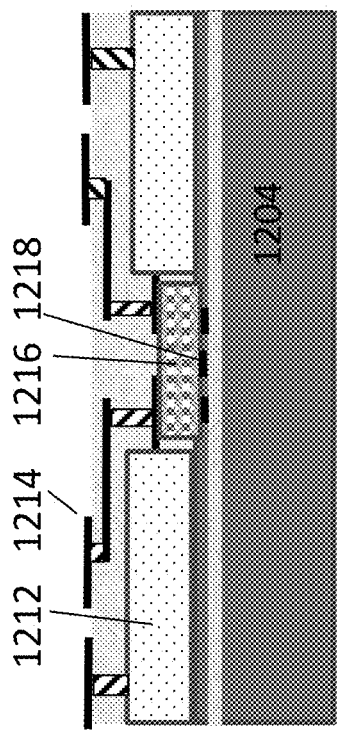
FIGS. 12A-12B are example illustrations of a coupling level ready to be hybrid bonded to an over the circuit pin/pad structure.
Figure 12B:
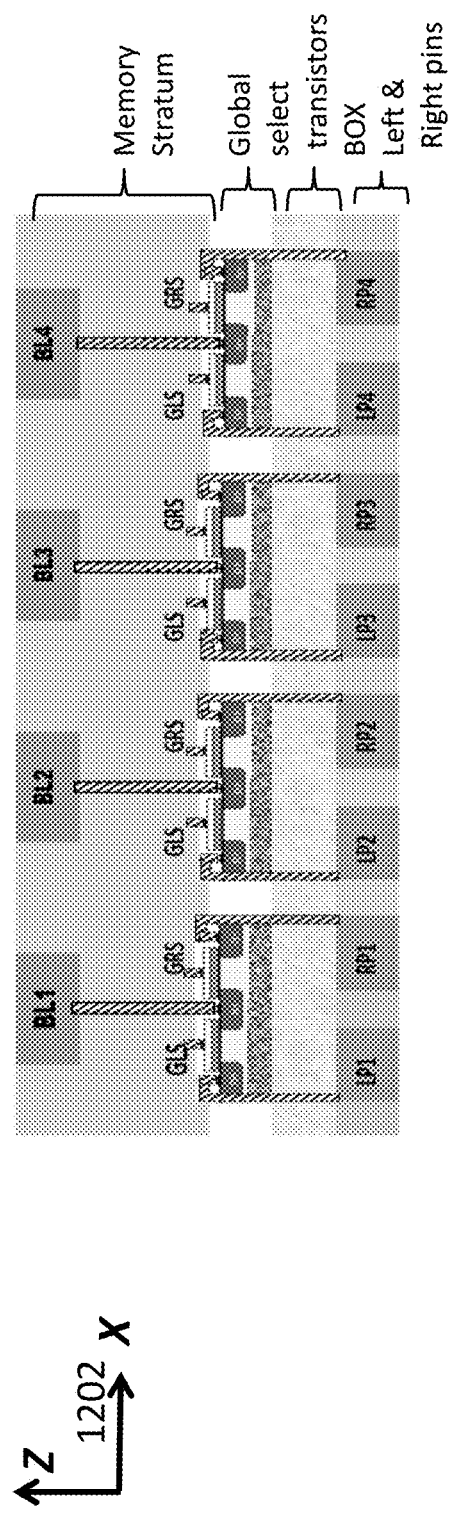

FIG. 12 is a section X-Z 1202 cut view of coupling level. Over a removable substrate 1204 a switchable bottom pin/pad 1218 are constructed following the concept presented in reference to FIG. 1A-FIG. 3C, of PCT/US2018/052332. The transistor selection 1216 could be similar to the illustration FIG. 12B which is of FIG. 2E of PCT/US2018/052332. The selected signal, called there BL1-BL4, could be connected to over the circuit pin/pad structure 1214, which could be formed according to a standard. The coupling level could have a very simple control circuit 1212 to perform the electronic alignment selection such as between GLS to GRS. The structure could include larger pin/pads for power supply connection, not shown. The control circuit 1212 could utilize two connected test pin/pads in the target level to measure connectivity and accordingly select between which GLS to GRS. Additional larger pin/pad could be use to connect optional level select control pin. Such level select control signal could be used to disable both GLS and GRS. Such level select could be useful for a case in which it is harder to form level select in the target wafer as presented in respect to DRAM as discussed in reference to FIG. 26A of U.S. Ser. No. 16/558,304, incorporated herein by reference.

While use of a coupling level with level select or the technique discussed in reference to at least FIG. 26A of U.S. patent application Ser. No. 16/558,304 (U.S. Patent Publication 2020/0176420 A1) are an alternative to level select within a memory level, it might be preferred to add the required additional process step for the memory level process in order to have level select within it. The type of level select could be engineered as part of the design of such M-Level. Such a design could accommodate single transistor types such as n-type and some relaxed select transistor spec compensated by other element of the M-Level such as design of the sense amplifier to support in memory level, level select as presented in reference to at least FIGS. 22C-22E of U.S. patent application Ser. No. 16/558,304 (U.S. Patent Publication 2020/0176420 A1).

FIG. 12A illustrates the coupling level ready to be hybrid bonded to an over the circuit pin/pad structure. If the need is to bond to in-between pin/pad structure then a carrier wafer could be used to flip the structure so it will bond first to in-between pin/pad structure.

The use of level transfer in 3D integration is often referred to as parallel device integration rather than sequential integration. In parallel device integration, both wafers are processed separately (usually after transistor formation and some metallization) and then after, integrate them using a major process step, for example, such as, with hybrid bonding. This concept could be further extended to a method to integrate a 3D system, for example, such as, in reference to FIG. 7A herein. Such a 3D system may utilize more than one type of memory and memory technology accordingly. The most common memory in computing systems are SRAM or Ferro Electric memory being developed by FMC for the ultra-fast memory such as cache, DRAM for the majority of the fast memory such as main memory, and NAND flash for the high density memory such as data storage. Systems may include NOR type flash for the program code storage and other types of memories such as cross-point memory, MRAM, or RRAM. In a 3D heterogeneous integrated system, these memories could be integrated by level transfer of a memory wafer processed in the proper wafer fab line utilizing the specific processing required for that memory technology. The parallel integration process could be used to accomplish the integration in phases. A First phase could be processing the needed wafers in the proper fab line which may include front end of line processing (transistors) and back end of line processing (interconnects). The Second phase could include level transfer to form a 'master level' or 'memory level', which could be called the M-Level. Accordingly a memory control wafer (perhaps formed via the first Phase) could be transferred on top of the memory wafer (perhaps formed via the first Phase, likely in a different fan line) to form an M-Level wafer. M-Level wafer may be stored whilst awaiting use in a 3D system. After the formation, and perhaps stockpiling of M-level wafers, these M-Levels could be transferred and integrated to form a desired 3D system, as one example is illustrated in FIG. 13. The memory control could comprise circuits (also known as 'memory periphery' especially in 2D devices) such as decoders, sense amplifiers, charge pumps, self-test logic and similar memory control circuits. It could include vertical connections to the memory level providing the word-lines, bit-lines, level select and so forth. The memory control could use hybrid bonding connection techniques such as been presented in reference to FIGS. 4A-4C, FIGS. 5A-5E and FIGS. 12A-12B herein, and FIG. 21A to FIG. 27D of U.S. patent application Ser. No. 16/558,304, publication 2020/0176420, and FIG. 1A to FIG. 3C of PCT application PCT/US2018/52332, all incorporated in their entirety herein by reference.

Figure 13A:
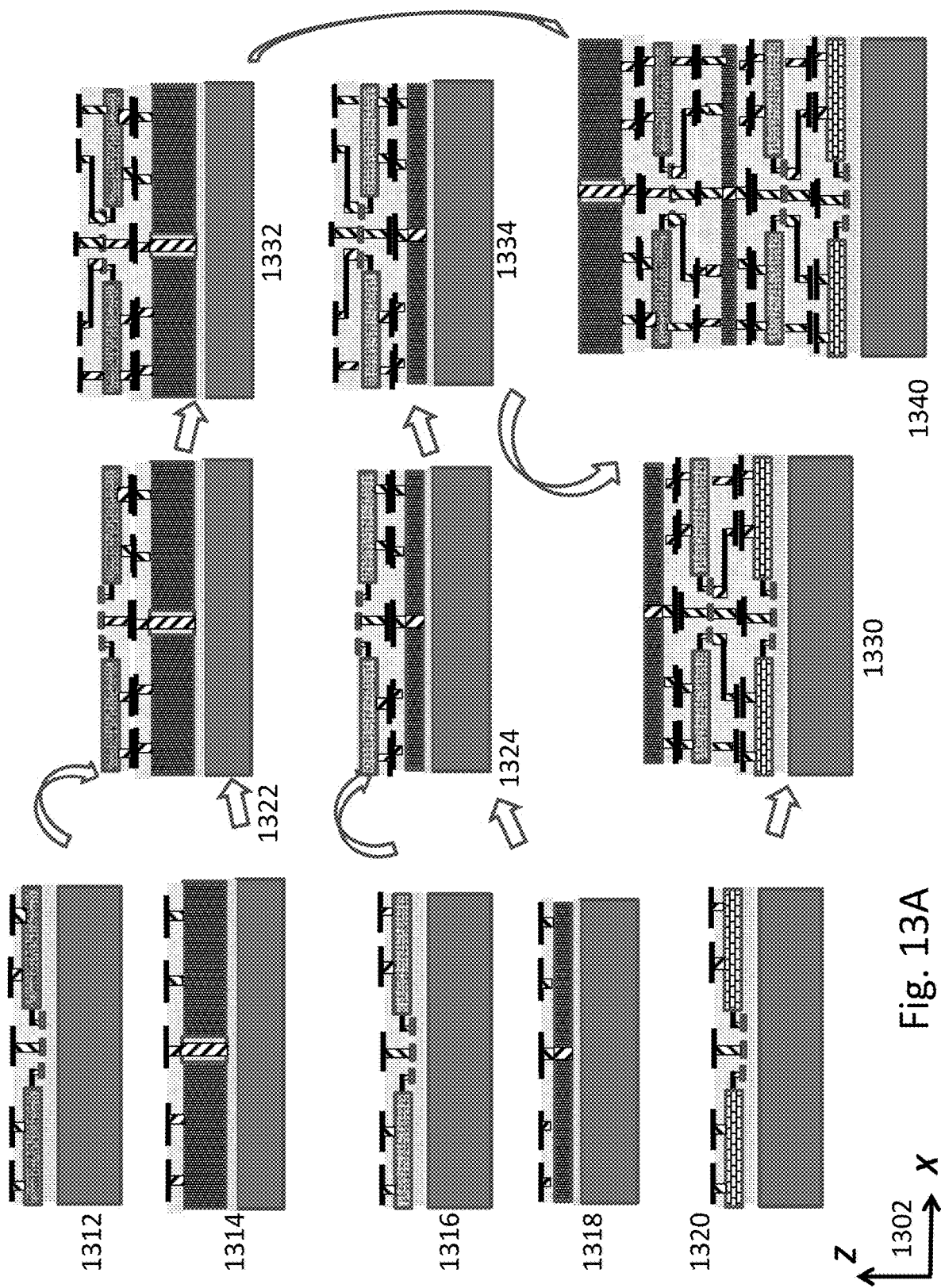
FIGS. 13A-13B are example illustrations of phased integrations of various 3D systems and the forming of various M-levels.

FIG. 13A is an X-Z 1302 side view illustration of a wafer region. It illustrates a phased integration of a 3D system. In the first phase, each of the wafers is processed in its respective process line such as a logic line for the processors level 1320, DRAM line for the fast memory 1318, DRAM memory control 1316, 3D NAND line for the high density memory 1314, and 3D NAND control logic circuits 1312. Alternatively, DRAM memory control logic wafer 1316 can be processed from a logic fab which is different from the DRAM line. Likewise, 3D NAND control logic wafer 1312 can be processed from a logic fab which is different from the 3D NAND line. DRAM memory wafer 1318 may include only memory cells. Alternatively, DRAM memory wafer 1318 could include memory cells and some core logic function such as sense amplifier and row/column decoder. 3D NAND wafer 1314 may include only memory cells. Alternatively, 3D NAND wafer 1314 may include memory cells and some core logic function such as sense amplifier, row/column decoders, and control line select gates. The DRAM memory control logic circuit 1316 and 3D NAND control logic circuit 1312 includes at least one of data buffer, address buffer, control buffer, mode resistor, error-correction control circuit, built-in test.

In the second phase, the M-Levels are formed by flip and bond (hybrid bond) the DRAM control circuit 1316 over the DRAM circuit 1318 and substrate backside cut such as by using at least one of etching, grinding, or polishing the DRAM control substrate resulting in a bonded structure 1324, and adding in the pin/pads level resulting in M-Level for the DRAM 1334. Similarly flip and bond the 3D NAND control circuit 1312 over the 3D NAND circuit 1314 and substrate backside cut such as by using at least one of etching, grinding, or polishing the 3D NAND control substrate resulting in a bonded structure 1322 and adding in the pin/pads level resulting in M-Level for the DRAM 1332. Then in the third phase, the DRAM M-Level 1334 is flipped and bond over the processor level 1320, cut the DRAM substrate resulting in a bonded structure 1330, then add in as needed pin/pads structure and follow by flip and bond the NAND M-Level 1332 over the structure 1330, and cut the NAND substrate resulting in a bonded structure 1340.

The memory control signals such as data path, address, and commend lines could be shared between DRAM M-Level 1334 and 3D NAND M-Level 1332. The DRAM M-Level 1334 and 3D NAND M-Level 1332 could have their own dedicated control signals.

Figure 13B:
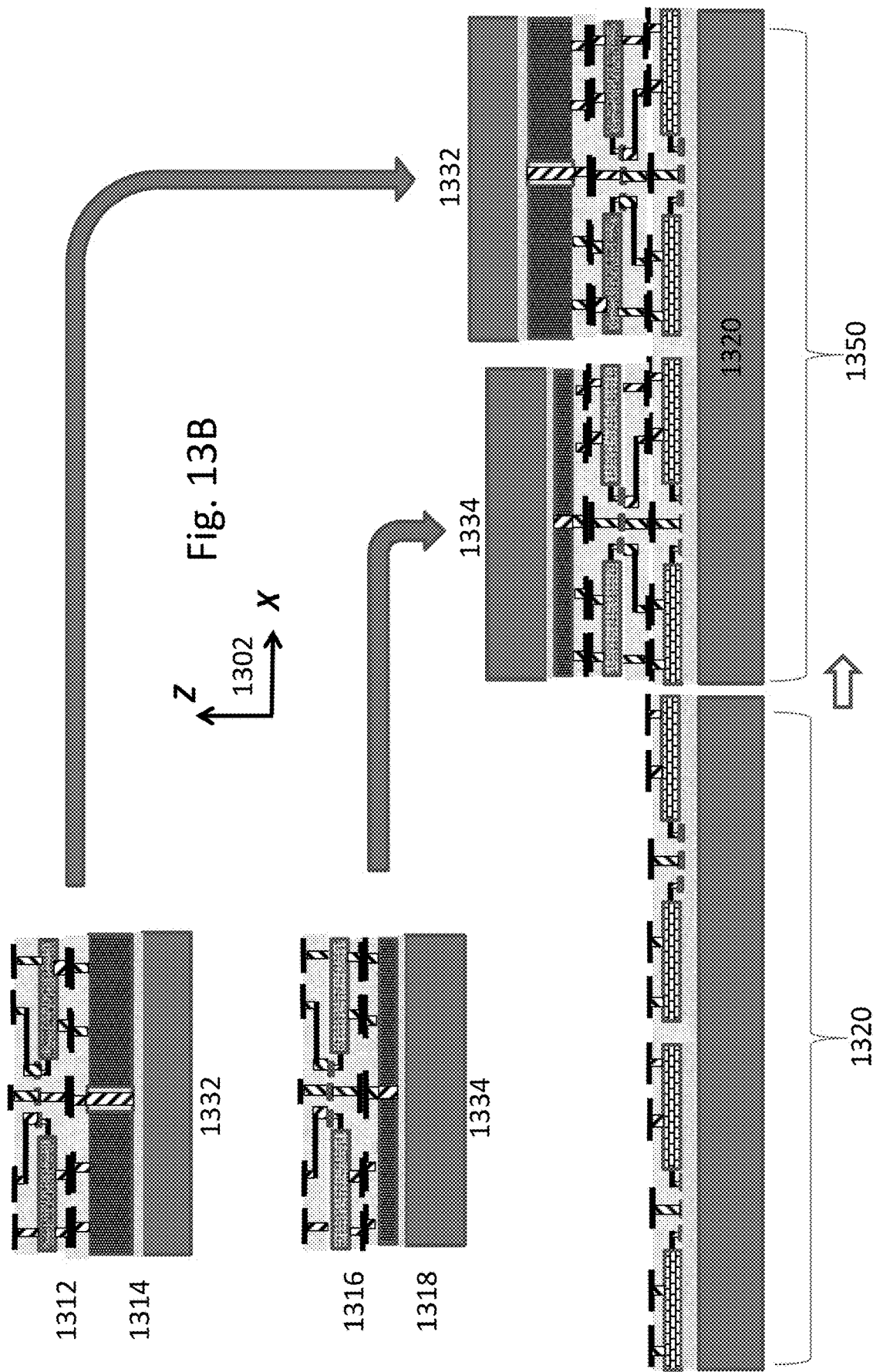

FIG. 13B is an X-Z 1302 side view illustration of an alternative phased integration to form a 3D system. M-Level for the DRAM 1334 and M-Level for the 3D NAND 1332 may be processed separately and perhaps banked. The DRAM M-Level 1334 and 3D NAND M-Level 1332 are flipped and bonded over the processor level 1320 in, for example, a side by side arrangement (other arrangements are possible, touching edges, only touching one corner, etc., all determined by engineering and manufacturing considerations), forming 3D system structure 1350.

It should be noted that the use of DRAM or 3D NAND herein is representative of high speed/volatile memory or high density/non-volatile memory. As other memory technologies are becoming useful, for example, such as SRAM, cross-point memory, PCRAM, RRAM, FRAM, and MRAM, these memories could be integrated in a 3D System just as well as the presented concept.

As previously presented, a 3D system could be constructed utilizing industry standards for unit size and pin/pad locations. The use of structures such as the M-Level could allow adhering to the standard while keeping flexibility for system architecture. Such could be the aggregating of multiple units in an M-Level for a specific application by that level control circuit.

Such a flow could have many variations including where within one M-Level are included multiple memory levels first being bonded to form first a 3D memory structure such as presented in reference to at least FIG. 21H, FIG. 25C, FIG. 25J, and FIG. 26A of U.S. patent application Ser. No. 16/558,304, publication 2020/0176420, incorporated in its entirety herein by reference.

With an M-Level integration the 3D system vertical connectivity per unit could be scaled down to a bus format. Accordingly, the vertical connectivity could include an address bus which could be decoded to the word-lines, bit-lines by the memory control circuits of each M-Level. The system level vertical connectivity per unit could count about a hundred lines rather than thousands of lines. The feed through concept such as feed-through per units 718 of FIG. 7B herein could be used for such vertical per unit bus. The vertical lines or pillars could be allocated, for example, to 32 data, 34 Addresses, 4 system types, 16 controls, and 14 feed-throughs. Specific systems could use more or less than 100 pillars lines bus per unit. Such vertical busses could utilize techniques common in the industry for computer system busses, such as multiplexing data or address lines or use of an industry standard such as AMBA, Avalon and so forth. A range of industry On-Chip bus standards are reviewed in a paper by Mitić, Milica, and Mile Stojčev. "An overview of on-chip buses." *Facta universitatis*-series: Electronics and Energetics 19.3 (2006): 405-428, incorporated in its entirety herein by reference.

FIGS. 14A-14B are vertical X-Z 1402 cut view illustrations of a region of such 3D system, at different scaling factors. FIG. 14A shows few units 1406 and the vertical bus 1408 in-between. The 3D system could be constructed over a functional substrate 1403 including a heat removal structure, trench capacitors or integrated inductors, and power distribution network(s) as previously discussed and a stack of heterogeneous integration of levels and M-levels 1404 as previously discussed. In addition to the vertical data bus the system could include a power bus to support distribution of power to the various levels. The vertical power bus could be in the same unit side or at the others sides. Other vertical common pillars could be used, for example, such as a common clock, and test signals. The unit side size could be 200 μm as often referenced herein or other sizes including different sizes both in X direction and in Y direction, for example, such as about 0.1 mm. about 0.2-0.4 mm. about 0.4-0.8 mm, about 0.8-1.2 mm, about 1.2-1.6 mm, about 1.6-2.2 mm, about 2.2-3.5 or even larger than about 3.5 mm.

FIG. 14A illustrates the use of redundancy for the vertical pillars 1414 for such bus common vertical connectivity. FIG. 14B shows that three vertical pillars 1414 are carrying the same signal of the vertical bus and are wired together to common horizontal signal 1416 fed into the M-level to be used. The M-level control circuit could include decoders and other control circuits including bus de-multiplexing, level select, power generation including voltage pumps circuits and other circuits such as often called memory periphery circuits.

FIG. 14B illustrates a portion of a 3D system having a functional substrate 1411, a processors level 1420, a high speed M-level 1422, a high density memory M-level 1424, horizontal electromagnetic interconnect M-level 1426, and input output M-level 1428 to connect the 3D system to external devices. The 3D system could also include a thermal isolation layer 1421 to isolate the processor heat from the overlaying memory level, and shielding layer 1425 to protect the underlying levels from the EMI noise that could be associated with the electromagnetic interconnect M-level 1426.

The 3D system of FIG. 14A-14B could include coupling level(s) such as previously discussed or a coupling level to interface the industry standard used in the system to a level or M-level built for other standards. Such a coupling level could be considered as standard to standard coupling level.

FIG. 14C is a horizontal cut X-Y 1432 illustration of a region of a 3D system, showing a sub array of 6×3 units 1438 with their associated side vertical pillars of bus lines 1434 and 1436; these could include their redundancies pillars. While FIG. 14C illustrates the vertical bus pillars 1434, 1436 as blocking the gap between units it could be expected that the design of such 3D system could be made to support connectivity X-Y connectivity between adjacent units and across units (not shown). These designs could be made by engineers in the art to accommodate the tradeoffs associated with the vertical pillars, pin/pads design rules and number of vertical pillars and their redundancies, units size and other system considerations and design rules.

Additional alternative to accommodate bonding misalignment while still using hybrid bonding could be the technique presented in reference to at least FIGS. 93A-94C of U.S. Pat. No. 8,395,191, incorporated in its entirety herein by reference.

An additional advantage of the use of M-level concept is for pre-testing. In reference to at least FIG. 86C of U.S. Pat. No. 8,395,191, incorporated in its entirety herein by reference, a concept of contact-less or wireless testing has been presented. Such could be used to perform testing of an M-level designated to be integrated to a 3D system. Probe test or other form of tests including use of self-test and scan based testing could be used to test a level and mark any unit that has a fault that could not be overcome by the unit level redundancy. Such pretesting could be an important part of 3D system integration to enable overall system yield. Furthermore, M-Level may include post-package repair function by containing redundancy rows and columns of memory cells, address map/re-map blocks, built-in test, anti-fuse. M-Level may even further include soft-post package repair circuit. In addition, M-Level may also include on-chip error-correction circuits.

In such manufacturing operation there are multiple advantages and operational alternative options following such levels and M-level tests prior to performing the 3D integration using, for example, such as hybrid bonding. One option is to select high yield levels and M-levels for 3D integration while lower yielding levels could be used for other applications such as standard memory products or other standard functions. The lower yielding level could be integrated also in 3D techniques to a structure with fewer levels in which such yield loss could be acceptable or repaired. Another option is to performing matching of levels to maximize the 3D system yield by matching levels for minimal yield loss by aligning the faults so as many faulty units are overlaying other faulty units. The unit based 3D system architect in which each units has its own vertical connectivity and power delivery could be used to support functional overall system even if some of the units do have faults and should be disabled. This could be considered as a redundancy or agile system reconfiguration. So using test such as scan based or other types of Build In Test ("BIST") the system disables units that could not be repaired with their built-in redundancy.

Figure 14D:
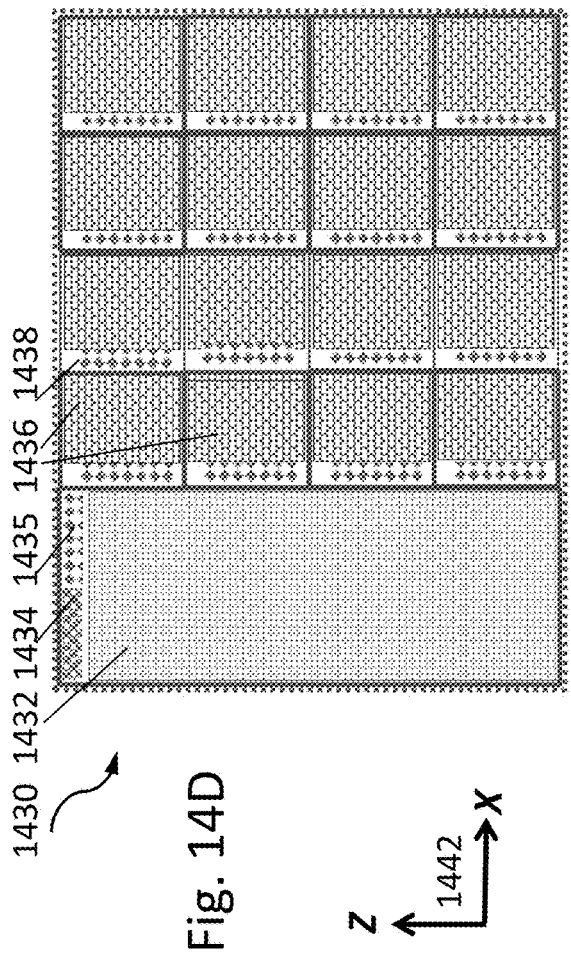
Figure 14E:
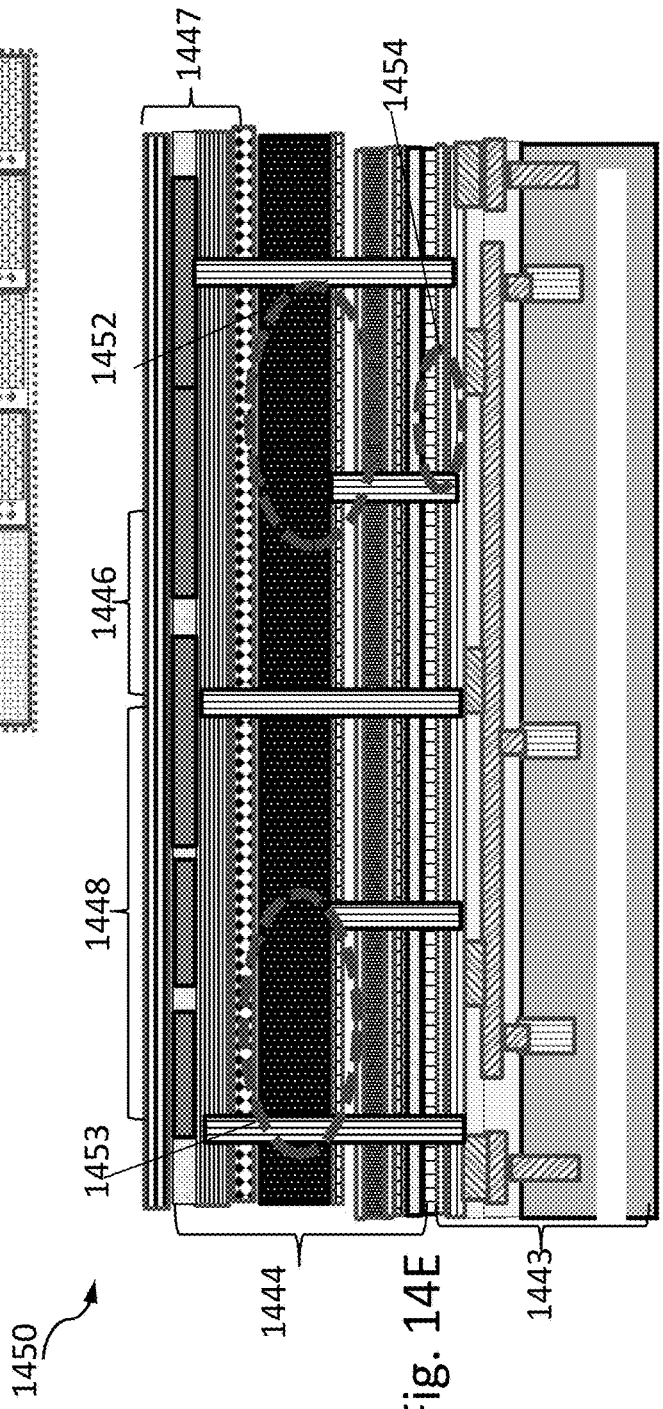

FIG. 14E vertical X-Z 1442 cut view illustrations of a region of an alternative 3D system 1450 which includes a mixed 'grain' M-level 1444 and functional substrate 1443. In such alternative the upper region of an M-level could have courser unit partitions 1448 than the lower level partitions 1446. The upper M-Level could include a level or levels which includes high density memory, for example, such as, 3D NAND type memory. Such memory is associated with far longer access times and could support the system performance with reduced vertical connectivity. Other variation of the 3D system modularity could be useful in some applications.

An additional option with the 3D system is illustrated in FIG. 14E is to move the process rather than the data, namely a memory centric architecture. For years the common practice has been to bring the data to the processor to compute a required instruction. As the amount of data keep growing, an alternative approach could be more efficient and it is to bring the processing units to the data. In a 3D system as presented herein, a massive amount of data could be stored in the 3D system, forming pooled memory. As an example, the data related to the U.S. (United States) could be stored in locations marked by US data (bubble) 1452 and data related to Europe could be stored in locations marked by Europe data (bubble) 1453. So if a search or other operation is to be done to U.S. data, the proper program could be transferred to the processors close to the U.S. data, marked by close processors (bubble) 1454. In some systems the processor could include programmable logic such as FPGA gates and related structure of programmable logic. Accordingly, the proper bit-stream to program the configurable logic could be transferred to the close processors (bubble) 1454 in proximity to the data designated for the processors 1452. Another variation of this concept could be for solving a problem in which a massive amount of data is required to be processed and then followed to a follow-on process such as in deep neural network. In such case it might be more efficient to store the processed data near to the original data (bubble) 1452 and move in a new program to the close by processors (bubble) 1454 for the next processing step. Thus, processing energy will be significantly lower due to the close proximity of data and processor, and the raw performance will be greater.

The 3D system as has been presented herein in reference to FIG. 13A to FIG. 14E is about various heterogeneous constructions of a modular 3D system. The M-Levels may have very high connectivity between the memory control level and the memory level with hundreds or thousands of vertical connections per unit for the bit-lines and the word-lines, and additional control as needed for example, such as, level select. Such vertical connectivity could utilize hybrid bonding and pin/pads structure(s) similar to the one presented herein in reference to FIGS. 5A-5E, or such as has been presented in reference to at least FIG. 21H, FIG. 25C, FIG. 25J, and FIG. 26A of U.S. patent application Ser. No. 16/558,304, publication 2020/0176420, incorporated in its entirety herein by reference. It could also use techniques such as been referenced herein, such as, for example, as electronic alignment. It could also use other techniques such as been reference as smart alignment in the incorporated by reference art. Such rich vertical per unit connectivity could be used within the M-Levels, while at the 3D system far more relaxed vertical connectivity could be used leveraging the vertical bus per unit concept—reference, for example, FIG. 14A-14C herein. Accordingly each level in the 3D system could support the vertical connectivity of the bus per unit. Some levels could support it as a feed-through and others also via a connectivity bus or busses between levels in the system. Reference to FIG. 7G the vertical bus signal 758 is illustrated as feeding the memory control 739 of the M-Level and also as feeding through 755 to the memory level 752. As previously discussed, the design of a memory level could include the design of the feed-through pillars to support the connectivity of the vertical per unit system bus. Accordingly the 3D system could include moderate vertical connectivity per unit such as about hundred pillars per unit bus and rich connectivity within the M-Levels such as a thousand pillars per unit to support the connections between the memory control level and the memory array of the word-lines and bit-lines 753. Different vertical connectivity techniques and alignments techniques could be used for the vertical busses and the per M-Level internal vertical connectivity.

In some 3D systems the vertical connectivity could include more than one vertical bus per unit. These vertical buses could have different functions, for example, such as one vertical bus connecting memory M-Levels to the processors level which could be called M-bus. And an additional vertical bus connecting the X-Y connectivity M-Level to the processor level which could be called C-Bus. For example, the M-bus in some systems might not even be extended to the X-Y connectivity M-Level, and the C-bus in some systems might not just feed through the memory M-Level. The C-bus could be similar to the M-bus or very different, for example, such as utilizing different industry bus standards and so forth. The bus per function could be extended to a bus for high speed memory which could be called SM-bus and a bus for high density memory which could be called DM-bus. The SM-bus could be designed for high speeds, for example, such as using a wide data bus of more than 16 pillars for data while the DM-bus could be designed for high integrity with, for example, built-in redundancy and error correction features.

In some systems the unit could have subunits such as been illustrated in FIG. 14D, an X-Y 1442 cut view illustration of an example of a unit 1430 with sub-unit for communication processor 1432 and 16 sub-units 1436 of AI processors. The communication processor 1432 could have a C-bus 1434 for communicating with the X-Y connectivity M-Level, and a M-bus to connect it to its overlaying memory. The AI processors 1436 could have an M-bus to connect it to its overlaying memory. Additionally the processors level could have a horizontal bus (not shown) connecting the AI processors to the communication processor 1432. The sub units 1436 could have a side size of 100 μm or other sizes as was referenced herein previously for unit size. The system could include a mix of different types of units optimized for the different type of tasks. Many other variations of these concepts could be designed by an engineer in the art to construct a 3D system capable of efficient parallel processing and also serial processing with across-the-system effective connectivity.

An additional alternative is to extend the M-bus to far larger number of data pillars, for example, such as 80, 160 or even more than 320. Such extended M-bus increase the data communication between the processing level and the memory level for supporting an increase in overall processing speed/performance.

With an extra wide data bus and units level partition of the memory array, a memory level based on 3D NAND technology could provide a reasonable data rate to serve in the role of high speed memory for the system. Such 3D NAND technology could be modified to utilize extreme thin tunneling oxide, thereby giving up retention time to gain faster write and erase time and far better endurance as discussed in at least U.S. Pat. No. 10,515,981 and PCT application PCT/US2018/016759, incorporated herein by reference. Modifying 3D NAND technology for Ultra-Low Latency memory is been practiced in the industry by Samsung with their product line called Z-NAND. Such a concept could be further enhanced by use of extremely thin tunneling oxide, a very wide data bus, and partition of the memory array to hundreds of units leveraging stacking of memory control over the 3D NAND memory arrays as has been presented herein and in some of the incorporated references.

In general, the 3D system presented herein could resemble prior systems which used to connect chips and packages employing Printed Circuit Board ("PCB"). Many of the system architectures of those PCB integrated systems could be mapped to the vertical 3D system presented herein.

The M-Level concept could be extended beyond memory to other functional elements of the 3D system. Such could be the X-Y interconnect using electromagnetic waves. Connectivity M-Level could include a control level, modulation and decoding level and the transmission lines/waveguides levels. So the bus vertical connectivity could be used by the X-Y interconnect controller which could then propagate the information to the X connectivity channels and the Y connectivity channels.

Wafer scale 3D systems as presented herein would likely need redundancy and yield repair or yield agility to become a commercially viable technology. Such has been presented herein and in the incorporated by reference art including multiple techniques such as in reference to FIGS. 35A-35C, FIGS. 38A-38C of U.S. patent application Ser. No. 16/558,304 (publication 2020/0176420), incorporated herein by reference. Additional 3D based redundancy and repair technology has been presented in reference to FIG. 17 and FIG. 24A to FIG. 44B of U.S. Pat. No. 8,994,404, incorporated herein by reference. Each M-Level in the 3D system could include its own self-test and repair technology, as is known in the art for memory and mission critical circuits. Additional techniques for 3D systems could include adding redundancy M-Level such as a second back up level for the X-Y connectivity M-Level. Or adding a redundancy vertical bus per unit. These redundancy levels could be connected in so they are used to enhance the system and provide fault tolerance, agility for defects, and graceful ageing.

The 3D system as presented herein is utilizing many units which have processor memory and able to interconnect utilizing X-Y connectivity level. Such systems are sometimes referred to as a 'network on chip' (NoC). Such a system could manage defects by either calling spare units to be activated to replace defective units or provide an advance task allocation capability to distribute the work load to the available good operational units. Concepts for such complex systems with self-repair and operational agility are well known in the art and are in use such as with server farms and other multi computer systems. Such technologies could include use of a circuit known as a "watch dog" in which good operational units would periodically trigger the watch dog circuit announcing that the unit is in good operational condition. If the watch dog is left too long without such trigger, it could activate a unit fail safe mode. Therefore, once a failed unit is detected, the watch dog circuit could activate a controlled vertical bus disconnect to isolate the failed processor from the vertical bus to avoid the failed unit from affecting the operation of other units of the 3D system. In such a situation the circuit could also initiate a processor reboot to overcome temporary faults and revive unit operation. If the fault is permanent then in addition to bus isolation the watch dog circuit could control the processor central operating clock circuit to further reduce the damage of the faulty unit processor and reduce its power consumption. In addition the 3D system could include system procedures in with periodically each of the unit is been ping by the 3D system task allocator processor. And if a unit is deemed faulty by the task allocator processor then a recovery operation could be activated to assign a spare unit to replace the faulty unit. Alternatively the 3D System could include agility to reallocate the system task between the operating units. An artisan in the art of large scale multi computers system could design such built-in test, detection, and recovery technology into the design of the 3D system.

Another alternative for such 3D systems is to have levels constructed by multiple die transfer instead of one wafer transfer as been presented in reference to FIG. 43A-43E of U.S. patent application Ser. No. 16/558,304, publication 2020/0176420, incorporated herein by reference. Such die level transfer could also utilize a technique called 'Collective Die to Wafer Direct Bonding' as presented in a paper by Inoue, Fumihiro, et al., "Advanced Dicing Technologies for Combination of Wafer to Wafer and Collective Die to Wafer Direct Bonding." 2019 *IEEE 69th Electronic Components and Technology Conference (ECTC)*. IEEE, 2019; also by Nick Flaherty titled "Collective die-to-wafer bonding with sub-2 µm accuracy for 3D packaging" ee News Europe, Oct. 19, 2020; and by Brandstätter, Birgit, et al. "High-speed ultra-accurate direct C2W bonding" 2020 IEEE 70th Electronic Components and Technology Conference (ECTC). IEEE, 2020; all of the forgoing are incorporated in their entireties herein by reference. Such a die level transfer could utilize the M-Level concept to have the die transfer to a base level forming an M-Level which could be called DieM-Level and then transferred together onto the 3D system stack.

Such DieM-Level concept could be used for an X-Y connectivity M Level utilizing lasers, photodetectors, and waveguides as was presented in reference to at least FIG. 35A to FIG. 37B of U.S. patent application Ser. No. 16/558,304, publication 2020/0176420, incorporated herein by reference. Such DieM-Level may be implemented by silicon photonics which includes the photodetectors made by silicon-germanium alloy. The wavelength of the photonic connectivity may be about 1.3 um or about 1.5 um, but other useful wavelengths may be possible. Such DieM-Level could be part of a 3D system such as reference numeral 1447 of FIG. 14E herein. An example is presented in reference to FIG. 15A-15D herein which are X-Z 1502 cut view illustrations.

FIG. 15A illustrates a drive and control wafer 1504 having waveguides 1512 disposed over control and drive circuits 1514 over a cut-layer such as SiGe 1516 over a substrate 1518. The drive and control wafer 1504 could include connection pads 1506 for connecting the drive and control wafer 1504 to one or more laser diodes die 1520, which could be bonded on top, and transparent via 1508 to guide the laser beam to the beam splitter and direction change assembly 1510 and thus guide the laser beam(s) to the appropriate waveguides. Techniques for processing such waveguides and optical interconnect structures are known in the art such as been presented in U.S. Pat. Nos. 5,485,021, 5,987,196, 6,791,675, 7,203,387, 8,548,288, 9,197,804; and in a paper by Lo, Shih-Shou, Mou-Sian Wang, and Chii-Chang Chen. "Semiconductor hollow optical waveguides formed by omni-directional reflectors." *Optics Express* 12.26 (2004): 6589-6593, all of the forgoing are incorporated herein by reference. The laser diodes die 1520 could also be built on a substrate 1530 with optional cut-layer 1528. The laser diodes die 1520 could include many diodes each with its pin/pad connection in transparent vias output and support structures such as ground/power connections. The laser diodes could be built on crystal 1526 that is a good fit for laser generation for example, such as GaAs, InP, GaSb, GaN, etc. The crystal layer 1526 may be different material from the substrate 1530. For example, the crystal laser 1526 may be a crystalline direct bandgap semiconductor grown on a silicon substrate 1530 through a buffer layer. Alternatively, a piece of crystalline direct bandgap semiconductor that so-called die is transferred and bonded onto a silicon substrate 1530. The laser diodes die could include pin 1522 and transparent via 1524. In many cases the crystals used for laser diodes are not available on 300 mm wafer and accordingly die level transfer could be preferred for 3D integration applications.

FIG. 15B illustrates the bonding of a few laser diodes die 1520 on top of a drive and control wafer 1504.

FIG. 15C illustrates the bonded structure 1540 after thinning the substrate of the laser diodes dies 1520. If the laser diode dies 1520 are built with a cut-layer built-in then such a cut layer, for example cut-layer 1528 shown in FIG. 15A, could be used for this thinning step. Many of the crystals used for laser diodes are built using epitaxial growth on top of another crystal. Such a process could be used to form an etch stop cut-layer between the carrying substrate and the diode laser crystal. Following the thinning process other process steps could be used, for example, such as conformal oxide deposition, for filling the gaps between the laser diodes dies and then CMP to provide planarization. If needed, then steps to form connections pin/pads on now the top surface could be utilized.

FIG. 15D illustrated the structure of FIG. 15C after it was flipped over another substrate 1548 with cut layer 1546 and having its substrate 1538 removed. The structure of FIG. 15D could be made ready as a DieM-Level by adding the pads/pins for the C-bus future vertical connection (not shown).

The thinning of the dies substrate after they have been bonded to the target wafer as is illustrated in the step between FIG. 15B to FIG. 15C could be accomplished with grinding and wet-chemical/plasma etch back. For silicon based dies, a SiGe based cut-layer could enable extreme thinning to even below 500 nm final thickness. In some cases the thinning of the dies substrate could use other forms of etch stop or could be done to less extremes such as to 20 or 10 μm level without the use of a cut layer. This would be engineered to determine the optimum process for the particular product and structure needs. Much of these engineering tradeoffs and possibilities have been discussed in various constituents of the incorporated by reference references.

An additional consideration of such a 3D system is heat removal from the upper levels, for example, such as, the stack of heterogeneous integration of levels and M-levels 1404 of FIG. 14A herein. U.S. Pat. No. 8,674,470 incorporated in its entirety herein by reference, teaches the use of the power lines to provide heat removal paths from a level in a 3D structure to the bottom most or top most surface where the heat could be removed by air or fluid conduction. This could be an additional function of the per unit vertical pillars such as those used for the vertical bus. These pillars, for example, such as vertical pillars 1414 of FIG. 14B, could be designed to provide good conductivity of power to the specific level and also to remove the heat out of levels that could need heat removal. These heat removal pillars could be considered as 'thermal vias'. These pillars could be designed to have a good thermal path to the cooling substrate 1401 of FIG. 14A herein, while being electrically isolative. Methods of forming and utilizing a thermally conductive contact while being electrically non-conductive, for example, such as presented in reference to at least FIG. 6 of U.S. Pat. No. 8,674,470. And in a similar way these pillars could be thermally connected and electrically isolated up to and including the top level which could include the heat sink structure for heat removal by air or fluid conduction. In one embodiment, those via may be designed in a way to mitigate or even shield electromagnetic interference.

Moreover, thermal isolation techniques, methods, materials and structures such as disclosed in the entirety of U.S. Pat. No. 9,023,688 could be utilized in the 3D systems and devices disclosed herein. The forgoing U.S. patent and its entire contents are incorporated herein by reference.

FIG. 16A illustrates a side X-Z 1602 cut view of a 3D system similar to the one disclosed in FIG. 14E herein including an upper level 1604 of computing logic. A thermal isolation layer 1605 could be used to keep the heat of the computing logic 1604 from substantially reaching memory stack 1603 disposed underneath, and a heat-sink 1606 could be used to remove the heat out of and off the device/system. The normally conductive power lines (not shown) could be, in part, thermally connected and electrically isolated with respect to heat sink 1606 to help remove the formation and operational heat produced by internal stack 1603 from the top, in addition to heat removal thru to the bottom substrate 1601 with its liquid micro channel cooling 1610.

FIG. 16B illustrates a similar 3D system in which the upper level of compute logic has its own liquid cooling substrate 1614, which could include power delivery lines and trench capacitors in a similar manner as to the bottom substrate 1601. The liquid cooling substrate 1614 could be a part of silicon interposer, or separately fabricated and bonded into the 3D system, or even monolithically integrated with the base die of the silicon substrate of 3D system.

The motivation for hyper-scale integration could suggest adding more compute levels to a 3D system. Yet such compute levels could generate too much heat to be removed just by the power line network. It might be desired to embed levels with liquid micro-channel cooling inside the 3D stack and not just at the bottom and top as is illustrated in FIG. 16B. The micro-channel cooling can be fluidic channel of a coolant or heat pipe. These micro-channels could further be coupled with conventional passive cooling such as finned heat sink and ventilation slots. In one embodiment of this invention, a micro-channel can include forced convention device such as fans and nozzles. The coolant can be pumped loops of heat exchangers and cold plate outside of the 3D system.

The challenge is to manage the system vertical (Z direction) connectivity through a thick substrate which could support micro-channel cooling, such as presented by Colgan, Evan G., et al. "A practical implementation of silicon microchannel coolers for high power chips." *IEEE Transactions on Components and Packaging Technologies* 30.2 (2007): 218-225, incorporated herein by reference. Such substrate could be at least 50 μm thick and could require TSVs through it having diameters of about 5 μm. The pillars used for the vertical bus could use a through layer via, also called nano-TSV, with diameters of less than 1 μm. One approach to manage such vertical connectivity challenge could be to modulate the signal through the TSV such as by using RF interconnects or optical interconnects similar to what have been presented for the X-Y connectivity herein.

Figure 16D:
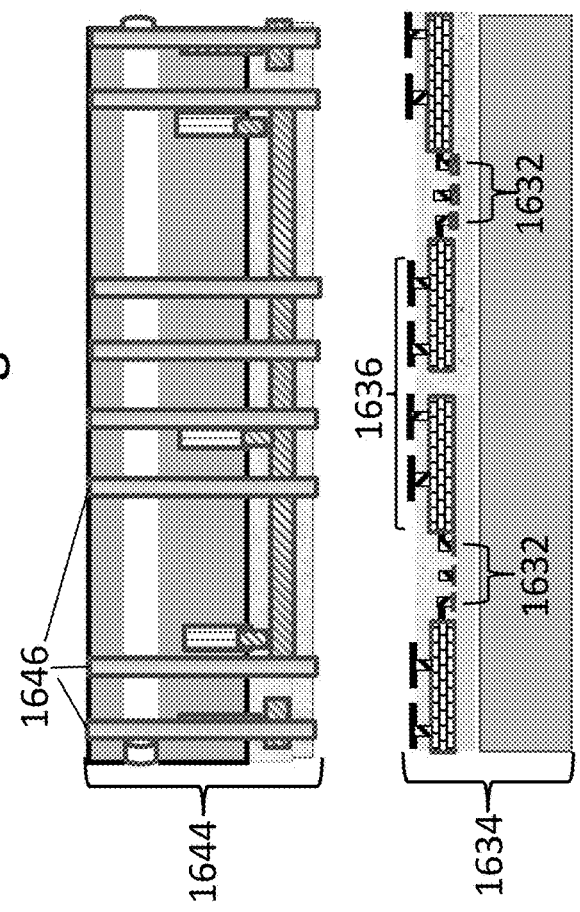
Figure 16C:
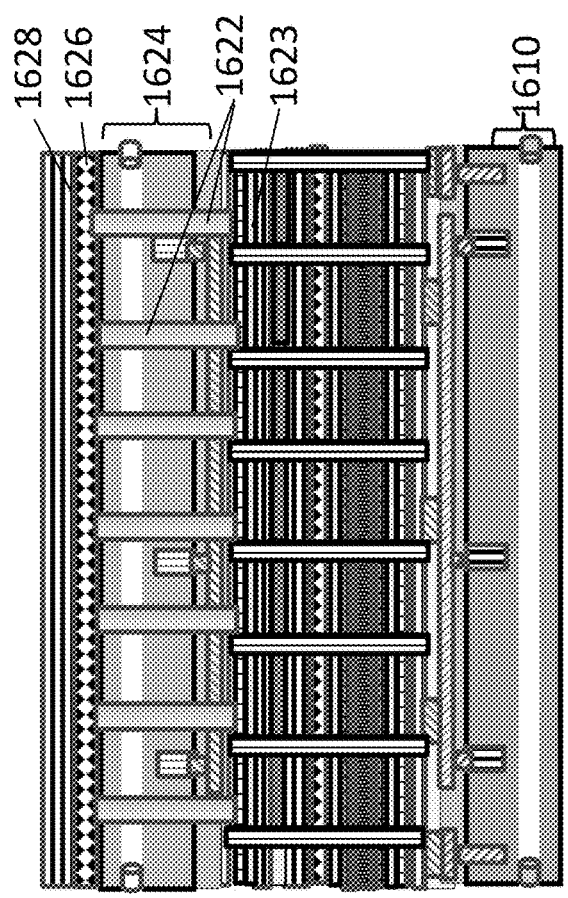

FIG. 16C illustrates a side X-Z 1602 cut view of a 3D system with embedded micro-channel cooling substrate 1624. The substrate could include TSVs 1622 which could be used for power line connectivity through the substrate and electromagnetic wave carrying modulated data. The layer below 1623 and the level above 1626 could include the circuits to control, generate, and detect the electromagnetic modulated data travelling through the TSVs 1622. The top level could include additional X-Y electromagnetic connectivity 1628 or connectivity to an external device which could support wireless connectivity.

For optical types of electromagnetic modulation, the via could be made optically transparent either by proper oxide filling or left unfilled. Similar optical via connectivity has been presented in U.S. Pat. No. 7,203,387, incorporated herein by reference.

For RF type of electromagnetic modulation the via could be copper filled or a Coax-like TSV transmission line using conformal side wall filling outer shell of metal, then an inner oxide, and then metal again. This structure could be accomplished by using ALD or other types of conformal deposition. RF-type TSVs are known in the art, for example, such as presented in U.S. Pat. Nos. 8,618,629, 8,759,950, 8,916,471, and in a paper by Bleiker, Simon J., et al., "High-aspect-ratio through silicon vias for high-frequency application fabricated by magnetic assembly of gold-coated nickel wires." IEEE Transactions on Components, Packaging and Manufacturing technology 5.1 (2014): 21-27; by Vitale, Wolfgang A., et al., "Fine pitch 3D-TSV based high frequency components for RF MEMS applications." 2015 *IEEE 65th Electronic Components and Technology Conference (ECTC)*. IEEE, 2015; by Ebefors, Thorbjörn, et al., "The development and evaluation of RF TSV for 3D IPD applications." 2013 *IEEE International 3D Systems Integration Conference (3DIC)*. IEEE, 2013; the entirety of all of the forgoing patents and papers are incorporated herein by reference.

Another option is to build special M-Levels designed for a cooling substrate to be inserted inside the 3D stack. Such a SubstrateM-Level could utilize conventional TSVs with a redistribution layer connecting these large TSVs to relatively smaller TSVs used in-between units for the per unit vertical bus. For a unit sized about 200 μm×200 μm, the area for 100 large TSVs 5 μm×5 μm could be about 100×5/200×5/200=1/16 of the unit area leaving room for the micro channels and the trench capacitor.

FIG. 16D illustrates a side X-Z 1602 cut view of a cooling substrate 1644 with TSVs 1646, and logic level 1634 with re-distribution layers and pads 1636 for the TSVs and in-between units pins for the vertical bus 1632 (two are shown).

FIG. 16E illustrates a side X-Z 1698 cut view of a SubstrateM-Level 1650 formed by adding top redistribution layer 1654 to the hybrid bonded structure of FIG. 16D. The per unit vertical bus pin/pads 1632, 1652 are connecting the vertical bus using the TSV 1646 through the cooling substrate. The cut layer 1656 could be used to separate the SubstrateM-Level from the carrying substrate 1658.

Using such a SubstrateM-Level a 3D system could include multiple compute levels and memory levels with X-Y connectivity levels in-between, while the system heat could be managed by liquid cooling.

For multiple level 3D systems it could be desired to add a logic level that could be optimized for data movement rather than data processing, for example, such as we have seen in the past with an Intel 8237, a direct memory access (DMA) controller, as part of the MCS 85 microprocessor system. Such a 3D system, as is illustrated in FIG. 16C, could include a base of water cooled processors level(s), overlaid by a high speed memory M Level, overlaid by high density memory M Level, overlaid by dedicated data movement M Level, overlaid by an X-Y connectivity M Level, overlaid by a high density memory M Level, overlaid by a high speed memory M Level, overlaid by an additional water cooled processor M Level, overlaid by a device to external system connectivity M Level. A heat spreader layer could be used to average the heat between the various units to reduce the local heat spots. A phase change material layer could be used to average the heat over time to reduce the momentarily heat peaks. And active heat management could be used by integrating per zone, for example, such as per unit temperature sensors integrated with temperature control circuits. Such temperature control circuits could also control the unit processor operations to prevent overheating. Such could be done by slowing down the processor clock or reducing the processor power voltage or affect the periodic quiet time, or activate a shut down. These active techniques manage the operating speed to avoid overheating. The outlined 3D system integration reduces the overall interconnects of the system and accordingly allows a far more power efficient and speed efficient computing system. Yet, power budgets and heat budgets provide limits to the 3D system operation. These heat management techniques allow optimized operation within such overall heat budget.

Another alternative is to include use of multiple steps of simple bonding and thinning, and then using TSV processing to form the vertical bus pillars through the levels-stack and then form the pin/pads for the full M-Level for the following steps of hybrid bonding integration. Such a flow is presented with the use of FIGS. 17A-17D. The advantage for such a flow is the saving of pin/pads formation for the inner levels of such a levels-stack.

FIG. 17A illustrates a side X-Z 1702 cut view of a base level 1706 and an inner level 1704. Each of these levels is structured as spaced units 1724 and in-between connections 1722 which could be used for later connection to the vertical bus pillar 1726. FIG. 17A also shows the two levels being bonded to each other creating structure 1708, in which the inner level 1704 has been flipped and bonded to the base level 1706.

Figure 17B:
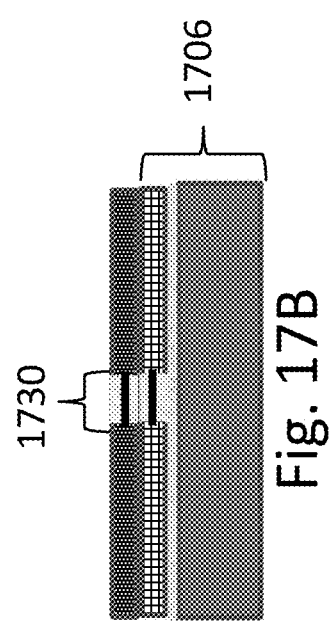

FIG. 17B illustrates the structure after removal, 'cut' of the inner level 1704 carrying substrate 1705.

Figure 17C:
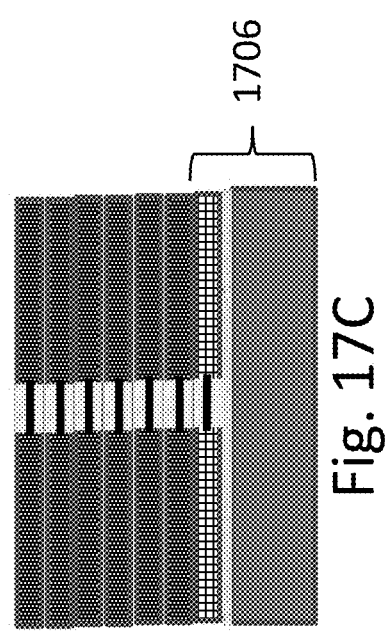

FIG. 17C illustrates the structure after repeating the process five more times forming a level-stack of base level and six inner levels bonded on-top.

Figure 17D:
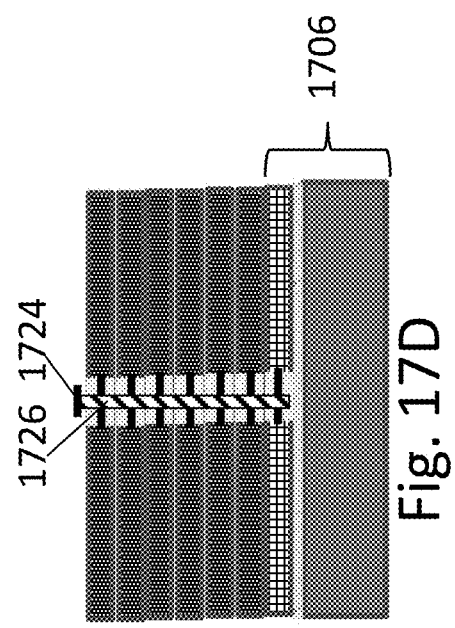

FIG. 17D illustrates the structure after forming a through stack via (TSV) 1726 and bonding pin/pad 1724. The inner level thickness could be about 100 nm or larger such as about 0.5 μm, about 1 μm, about 2 μm, about 4 μm or even more than 6 μm. The through stack via (TSV) 1726 (through the level-stack) could go through few tens of microns which is common for TSVs in the industry. The metal filling of the via could form simultaneously the connection to the horizontal between the units connection lines 1722. Such is not common and would need proper tuning of the process by an artisan in semiconductor processing. It reasonable to expect that such a through stack via would require larger space between units 1730 than what would have been required if the via would be formed for each level independently thus increasing the structure sizer, and yet the simplicity of the process could make it attractive in some applications. The industry is improving the etch technology for such vias and an aspect ratio of 1:20 has been demonstrated. Thus, for a level-stack of 20 μm thickness a via of about 1 μm diameter could be manufacturable.

In some 3D systems, for example, such as mobile systems, alternative (not liquid cooling unless recycled) heat management techniques could be used.

The 3D system as presented herein could be of a full wafer or diced to a sub-wafer size. Such dicing could be done in regular patterns which may be designed to match the yield to maximize the good yield structures out of the multi-level wafer structure. Such dicing could be done by many of the dicing techniques used in the industry. A more advanced dicing technique such as use of plasma etching could be effective and allow flexible dicing patterns as well as reducing the size of the dicing lanes (often called streets). The dicing or singulation pattern could use a mask pattern or mask-less patterns for even greater flexibility, especially when employing directional etching/matter removal techniques, for example, such as plasma based etching.

In general the construction of a 3D system as presented herein includes multiple steps of layer transfer. Such layer transfer could include flipping over a donor wafer on top of a target wafer and performing hybrid bonding. Then grind and etch back the donor wafer substrate leveraging a built-in cut layer, for example, such as SiGe. And if needed forming pins/pads for the next step. These steps could include an exchange role of donor wafer or target wafer and removing substrate from either or both as presented in reference to at least FIG. 13A herein and within many incorporated references. These steps of layer transfer could include use of a carrier wafer as presented multiple times in the incorporated by reference art or as presented in a paper by Jourdain, Anne, et al., "Extreme wafer thinning and nano-TSV processing for 3D heterogeneous integration." 2020 *IEEE 70th Electronic Components and Technology Conference (ECTC).* IEEE, 2020, incorporated in its entirety by reference. The use of a carrier wafer helps performing the back side adds of pin/pads on a side wafer rather than on the target 3D structure. Additionally it effectively flips back the transferred layer to be aligned to the target wafer in a non-flipped form. So, for example, in reference to FIG. 13A herein, the structure 1318 would have been a carrier wafer than the flow formation to the structure 1330 could be representative of a carrier wafer use prior to the final step of removal of the carrier wafer. The carrier wafer removal process/method could be similar to the removal of a substrate by using grind and etch back to a(n) (built-in) etch stop layer.

A 3D system presented herein could be considered as a semiconductor device and be integrated into a larger system using other integration technologies used in the industry such as Printed Circuit Board (PCB), interposers, substrates and integration techniques also known as 2.5D, as well as others.

It will also be appreciated by persons of ordinary skill in the art that the invention is not limited to what has been particularly shown and described hereinabove. For example, the use of SiGe as the designated sacrificial layer or etch stop layer could be replaced by compatible material or combination of other material including additive materials to SiGe such as carbon or various doping materials such as boron or other variations. And for example, drawings or illustrations may not show n or p wells for clarity in illustration. Further, any transferred layer or donor substrate or wafer preparation illustrated or discussed herein may include one or more undoped regions or layers of semiconductor material. Further, transferred layer or layers may have regions of STI or other transistor elements within it or on it when transferred. And for example the order of the levels and their function could be different from what have been illustrated here, the use of hybrid bonding or other type of bonding and the relevant alignment techniques and their vertical connectivity could be mix and matched using techniques presented herein or in the incorporated by reference art or elsewhere. Additionally the modular approach of a typical unit based architecture could support a desired flexible system construction such as dicing the 3D heterogeneous integrated wafer to a size of 40×40 mm2 system or too far larger sizes such as 100×100 mm2 system or even using the 3D wafer as a final system. Also the system could be designed with a mix of units having different sizes and/or different functionality including units to support AI calculation and units to support data management and system management. Furthermore, the 3D system could be extended beyond wafer sizes by utilizing panels with built-in wave guides or transmission lines as presented in respect to FIG. 43A to FIG. 43E of U.S. patent application Ser. No. 16/558,304, publication 2020/0176420, incorporated herein by reference.

There many options and engineering consideration to construct specific systems utilizing the techniques presented herein as those in the art could apply. Rather, the scope of the invention includes combinations and sub-combinations of the various features described hereinabove as well as modifications and variations which would occur to such skilled persons upon reading the foregoing description. Thus, the invention is to be limited only by the appended claims.

We claim:
1. A 3D device, said device comprising:
a first level comprising first transistors, said first level comprising a first interconnect;
a second level comprising second transistors, said second level overlaying said first level;
a third level comprising third transistors, said third level overlaying said second level;
a plurality of electronic circuit units (ECUs),
wherein each of said plurality of ECUs comprises a first circuit, said first circuit comprising a portion of said first transistors,
wherein each of said plurality of ECUs comprises a second circuit, said second circuit comprising a portion of said second transistors,
wherein each of said plurality of ECUs comprises a third circuit, said third circuit comprising a portion of said third transistors,
wherein each of said ECUs comprises a vertical bus,
wherein said vertical bus comprises greater than eight pillars and less than three hundred pillars,
wherein said vertical bus provides electrical connections between said first circuit and said second circuit,
wherein said vertical bus comprises un-decoded address information,
wherein each of said ECUs comprises vertical control lines,
wherein said vertical control lines comprise more than eight hundred pillars,
wherein said vertical control lines provide electrical connections between said second circuit and said third circuit, and
wherein said vertical control lines comprise decoded address information.

2. The device according to claim 1,
wherein said second level is bonded to said first level, and
wherein said bonded comprises oxide to oxide bonding regions and metal to metal bonding regions.

3. The device according to claim 1,
wherein said third level comprises an array of memory cells, and
wherein said second circuit comprises a memory control circuit.

4. The device according to claim 1,
wherein said third level comprises an array of DRAM cells.

5. The device according to claim 1,
wherein said first circuit comprises at least one processor.

6. The device according to claim 1,
wherein said vertical bus comprises less than one hundred and twenty pillars.

7. The device according to claim 1,
wherein each of said vertical control lines is connected to one horizontal memory control line.

8. A 3D device, the device comprising:
a first level comprising first transistors, said first level comprising a first interconnect;
a second level comprising second transistors, said second level overlaying said first level;
a third level comprising third transistors, said third level overlaying said second level;
a plurality of electronic circuit units (ECUs),
    wherein each of said plurality of ECUs comprises a first circuit, said first circuit comprising a portion of said first transistors,
    wherein each of said plurality of ECUs comprises a second circuit, said second circuit comprising a portion of said second transistors,
    wherein each of said plurality of ECUs comprises a third circuit, said third circuit comprising a portion of said third transistors,
    wherein each of said ECUs comprises a vertical bus,
    wherein said vertical bus comprises greater than eight pillars and less than three hundred pillars,
    wherein said vertical bus provides electrical connections between said first circuit and said third circuit,
    wherein said vertical bus comprises un-decoded address information,
    wherein each of said ECUs comprises vertical control lines,
    wherein said vertical control lines comprise more than eight hundred pillars, and
    wherein said vertical control lines provide electrical connections between said second circuit and said third circuit, and
    wherein said vertical control lines comprise decoded address information.

9. The device according to claim 8,
wherein said second level is bonded to said first level, and
wherein said bonded comprises oxide to oxide bonding regions and metal to metal bonding regions.

10. The device according to claim 8,
wherein said second level comprises an array of memory cells, and
wherein said third circuit comprises a memory control circuit.

11. The device according to claim 8,
wherein said second level comprises an array of DRAM cells.

12. The device according to claim 8,
wherein said first circuit comprises at least one processor.

13. The device according to claim 8,
wherein said vertical bus comprises less than one hundred and twenty pillars.

14. The device according to claim 8,
wherein each of said vertical control lines is connected to one horizontal memory control line.

15. A 3D device, the device comprising:
a first level comprising first transistors, said first level comprising a first interconnect;
a second level comprising second transistors, said second level overlaying said first level;
a third level comprising third transistors, said third level overlaying said second level;
a plurality of electronic circuit units (ECUs),
    wherein each of said plurality of ECUs comprises a first circuit, said first circuit comprising a portion of said first transistors,
    wherein each of said plurality of ECUs comprises a second circuit, said second circuit comprising a portion of said second transistors,
    wherein each of said plurality of ECUs comprises a third circuit, said third circuit comprising a portion of said third transistors,
    wherein said vertical bus comprises un-decoded address information,
    wherein each of said ECUs comprises a vertical bus,
    wherein said vertical bus comprises greater than eight pillars and less than three hundred pillars,
    wherein said vertical bus provides electrical connections between said first circuit and said second circuit,
    wherein said third level comprises an array of memory cells, and
    wherein said second circuit comprises a memory control circuit.

16. The device according to claim 15,
wherein said second level is bonded to said first level, and
wherein said bonded comprises oxide to oxide bonding regions and metal to metal bonding regions.

17. The device according to claim 15,
wherein each of said ECUs comprise vertical control lines,
wherein each vertical control line comprises more than eight hundred pillars, and
wherein said vertical control lines provide electrical connections between said second circuit and said third circuit, and
wherein said vertical control lines comprise decoded address information.

18. The device according to claim 15,
wherein said third level comprise an array of DRAM cells.

19. The device according to claim 15,
wherein said first circuit comprises at least one processor.

20. The device according to claim 15,
wherein said vertical bus comprises less than one hundred and twenty pillars.

* * * * *